(12) United States Patent
Zhang

(10) Patent No.: US 12,140,862 B2
(45) Date of Patent: Nov. 12, 2024

(54) NANO PATTERN MANUFACTURING METHOD, NANOIMPRINT SUBSTRATE, AND DISPLAY SUBSTRATE

(71) Applicant: BOE TECHNOLOGY GROUP CO., LTD., Beijing (CN)

(72) Inventor: Xiao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 305 days.

(21) Appl. No.: 17/607,814

(22) PCT Filed: Oct. 20, 2020

(86) PCT No.: PCT/CN2020/122086
§ 371 (c)(1),
(2) Date: Oct. 29, 2021

(87) PCT Pub. No.: WO2021/082981
PCT Pub. Date: May 6, 2021

(65) Prior Publication Data
US 2022/0187703 A1    Jun. 16, 2022

(30) Foreign Application Priority Data
Nov. 1, 2019   (CN) .................. 201911061678.X

(51) Int. Cl.
*G03F 7/00* (2006.01)
*H01L 27/12* (2006.01)
(52) U.S. Cl.
CPC .......... *G03F 7/0002* (2013.01); *G03F 7/0007* (2013.01); *H01L 27/1288* (2013.01)
(58) Field of Classification Search
None
See application file for complete search history.

(56) References Cited

U.S. PATENT DOCUMENTS

2010/0233432 A1    9/2010  Okushima et al.
2011/0042352 A1    2/2011  Okushima et al.
(Continued)

FOREIGN PATENT DOCUMENTS

CN    1876395 A    12/2006
CN    101765809 A    6/2010
(Continued)

OTHER PUBLICATIONS

The First Office Action of Priority Application No. CN 201911061678.X issued by the Chinese Patent Office on Jan. 27, 2021.
(Continued)

*Primary Examiner* — Shamim Ahmed
(74) *Attorney, Agent, or Firm* — IP & T GROUP LLP

(57) ABSTRACT

A method for manufacturing a nano pattern, includes: forming a pattern transfer layer on a base substrate having N imprint regions, and performing patterning processes on the pattern transfer layer to form an imprint pattern layer. A portion of the imprint pattern layer located in each imprint region is an imprint pattern, N imprint patterns are formed sequentially. Forming an i-th imprint pattern in an i-th imprint region includes: performing a patterning process on a portion of the pattern transfer layer located in the i-th imprint region to form the i-th imprint pattern; forming an i-th protective film on a side of the pattern transfer layer away from the base substrate; and removing at least a portion of the i-th protective film located in an (i+1)-th imprint region to obtain an i-th protective layer and expose a portion of the pattern transfer layer located in the (i+1)-th imprint region.

19 Claims, 15 Drawing Sheets

(56) References Cited

U.S. PATENT DOCUMENTS

| | | | |
|---|---|---|---|
| 2014/0349425 A1* | 11/2014 | Lee | G03F 7/0002 |
| | | | 438/29 |
| 2016/0299423 A1 | 10/2016 | Yeo et al. | |
| 2018/0088461 A1 | 3/2018 | Kim et al. | |
| 2019/0064406 A1 | 2/2019 | Hou et al. | |

FOREIGN PATENT DOCUMENTS

| | | | |
|---|---|---|---|
| CN | 101809501 A | 8/2010 |
| CN | 105911628 A | 8/2016 |
| CN | 107479121 A | 12/2017 |
| CN | 108681138 A | 10/2018 |
| CN | 109683445 A | 4/2019 |
| CN | 110764364 A | 2/2020 |

OTHER PUBLICATIONS

Notification to Grant Patent Right for Invention of Priority Application No. CN 201911061678.X issued by the Chinese Patent Office on Apr. 27, 2021.

* cited by examiner

NANO PATTERN MANUFACTURING METHOD, NANOIMPRINT SUBSTRATE, AND DISPLAY SUBSTRATE

CROSS-REFERENCE TO RELATED APPLICATIONS

This application is a national phase entry under 35 USC 371 of International Patent Application No. PCT/CN2020/122086 filed on Oct. 20, 2020, which claims priority to Chinese Patent Application No. 201911061678.X, filed on Nov. 1, 2019, which are incorporated herein by reference in their entirety.

TECHNICAL FIELD

The present disclosure relates to the field of display technologies, and in particular, to a method for manufacturing a nano pattern, a nanoimprint substrate and a display substrate.

BACKGROUND

Nanoimprint technology is a method for transferring a template pattern to a substrate by using an imprint template with micro-nano structure by contact imprinting due to the action of mechanical external force. As an important film patterning technology besides photolithography technology, nanoimprint technology overcomes problems such as resolution limit which are caused by diffraction phenomenon in optical exposure, and has advantages such as high resolution, low cost and high yield, thereby having broad application prospects in the field of semiconductor display.

SUMMARY

In a first aspect, a method for manufacturing a nano pattern is provided. The method includes: forming a pattern transfer layer on a base substrate, wherein the pattern transfer layer has N imprint regions, N being an integer greater than or equal to 2; and performing a plurality of patterning processes on the pattern transfer layer to form an imprint pattern layer. A portion of the imprint pattern layer located in each imprint region is an imprint pattern, N imprint patterns are formed in sequence. Forming an i-th imprint pattern in an i-th imprint region, i being an integer greater than or equal to 1 and less than or equal to (N−1) includes: performing a patterning process in the plurality of patterning processes on a portion of the pattern transfer layer located in the i-th imprint region to form the i-th imprint pattern; forming an i-th protective film on a side of the pattern transfer layer away from the base substrate; and removing at least a portion of the i-th protective film located in an (i+1)-th imprint region to obtain an i-th protective layer and expose a portion of the pattern transfer layer located in the (i+1)-th imprint region. The i-th protective layer is located at least in the i-th imprint region.

In some embodiments, performing the patterning process on the portion of the pattern transfer layer located in the i-th imprint region to form the i-th imprint pattern includes: forming an i-th adhesive layer on the side of the pattern transfer layer away from the base substrate; imprinting the i-th adhesive layer to obtain an i-th imprinted adhesive layer, the i-th imprinted adhesive layer including an i-th pattern to be transferred located in the i-th imprint region; and etching the portion of the pattern transfer layer located in the i-th imprint region to form the i-th imprint pattern corresponding to the i-th pattern to be transferred.

In some embodiments, a value of i starts from 1.

In some embodiments, the value of i is greater than or equal to 2, an orthogonal projection of the i-th pattern to be transferred on the base substrate and an orthogonal projection of at least one imprint pattern adjacent to the i-th imprint pattern to be formed on the base substrate have an overlapping region.

In some embodiments, a dimension of each overlapping region in a width direction thereof is 1 mm to 5 mm. The width direction is a direction, on a surface of the base substrate on which the pattern transfer layer is disposed, perpendicular to a boundary of two adjacent imprint regions where the overlapping region is located.

In some embodiments, forming an N-th imprint pattern in an N-th imprint region includes: performing a patterning process in the plurality of patterning processes on a portion of the pattern transfer layer located in the N-th imprint region to form the N-th imprint pattern; and removing a first protective layer to an (N−1)-th protective layer.

In some embodiments, performing the patterning process on the portion of the pattern transfer layer located in the N-th imprint region to form the N-th imprint pattern includes: forming an N-th adhesive layer on the side of the pattern transfer layer away from the base substrate; imprinting the N-th adhesive layer to obtain an N-th imprinted adhesive layer, the N-th imprinted adhesive layer including an N-th pattern to be transferred located in the N-th imprint region; and etching the portion of the pattern transfer layer located in the N-th imprint region to form the N-th imprint pattern corresponding to the N-th pattern to be transferred.

In some embodiments, an orthogonal projection of the N-th pattern to be transferred on the base substrate and an orthogonal projection of at least one imprint pattern adjacent to the N-th imprint pattern to be formed on the base substrate have an overlapping region.

In some embodiments, removing at least the portion of the i-th protective film located in the (i+1)-th imprint region to obtain the i-th protective layer includes: removing a remaining portion of the i-th protective film other than a portion located in the i-th imprint region to obtain the i-th protective layer.

In some embodiments, performing the patterning process on the portion of the pattern transfer layer located in the i-th imprint region includes: etching the portion of the pattern transfer layer located in the i-th imprint region through a first etching process; removing at least the portion of the i-th protective film located in the (i+1)-th imprint region includes: removing at least the portion of the i-th protective film located in the (i+1)-th imprint region through a second etching process. The first etching process is different from the second etching process.

In some embodiments, the first etching process is a dry etching process, and the second etching process is a wet etching process.

In some embodiments, a material of the pattern transfer layer includes at least one of silicon dioxide ($SiO_2$), silicon nitride ($SiN_x$), amorphous silicon (a-Si) or an organic material, and a material of the i-th protective layer includes at least one of indium tin oxide (ITO), indium gallium zinc oxide (IGZO) or metal.

In some embodiments, etching the portion of the pattern transfer layer located in the i-th imprint region through the first etching process includes: performing wet etching on the portion of the pattern transfer layer located in the i-th imprint region through a first etching solution; removing at least the portion of the i-th protective film located in the (i+1)-th imprint region through the second etching process includes: performing wet etching on at least the portion of the i-th protective film located in the (i+1)-th imprint region through a second etching solution. The first etching solution is different from the second etching solution.

In some embodiments, a material of the pattern transfer layer includes at least one of indium tin oxide (ITO), indium gallium zinc oxide (IGZO) or metal; a material of the i-th protective layer includes at least one of silicon dioxide ($SiO_2$) or silicon nitride ($SiN_x$).

In some embodiments, a thickness of the i-th protective film is 20 nm to 100 nm.

In some embodiments, the pattern transfer layer includes at least one film layer.

In some embodiments, the pattern transfer layer includes at least two film layers that are stacked and in contact with each other in a thickness direction of the base substrate, and performing the plurality of patterning processes on the pattern transfer layer to form the imprint pattern layer includes: performing the plurality of patterning processes on a film layer, farthest from the base substrate, of the at least two film layers to form a transition imprint pattern layer having N transition imprint patterns; and etching the transition imprint pattern layer and a remaining film layer of the at least two film layers until a film layer, closest to to the base substrate, of the at least two film layers is etched to form the imprint pattern layer corresponding to the transition imprint pattern layer.

In some embodiments, a thickness of the pattern transfer layer is 10 nm to 500 nm.

In a second aspect, a nanoimprint substrate including a nano pattern is provided, and the nano pattern is manufactured by the method described above.

In a third aspect, a display substrate including a nano pattern is provided, and the nano pattern is manufactured by the method described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, and actual processes of methods to which the embodiments of the present disclosure relate.

DETAILED DESCRIPTION

Figure 1:
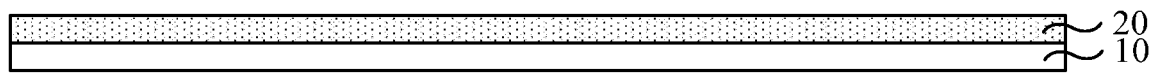
FIG. 1 is a structural diagram of forming a pattern transfer layer, in accordance with some embodiments.

Technical solutions in some embodiments of the present disclosure will be described clearly and completely below with referring to accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

As used herein, the term "if" is optionally construed as "when" or "upon" or "in response to determining" or "in response to detecting," depending on the context. Similarly, the phrase "if it is determined" or "if [a stated condition or event] is detected" is optionally construed as "upon determining" or "in response to determining" or "upon detecting [the stated condition or event]" or "in response to detecting [the stated condition or event]," depending on the context.

In addition, the use of the phrase "based on" is meant to be open and inclusive, in that a process, step, calculation or other action "based on" one or more of the stated conditions or values may, in practice, be based on additional conditions or values exceeding those stated.

The term "about" or "approximately" as used herein includes a stated value and an average value within an acceptable range of deviation of a particular value. The acceptable range of deviation is determined by a person of ordinary skill in the art in view of the measurement in question and the error associated with measurement of a particular quantity (i.e., the limitations of the measurement system). Exemplary embodiments are described herein with referring to cross-sectional views and/or plan views as idealized exemplary drawings. In the accompanying drawings, thickness of layers and regions are enlarged for clarity. In addition, exemplary embodiments of the present disclosure should not be construed to be limited to shapes of regions shown herein, but to include deviations in shape due to, for example, manufacturing. Therefore, the regions shown in the accompanying drawings are schematic in nature, and their shapes are not intended to show actual shapes of the regions, and are not intended to limit the scope of the exemplary embodiments.

Some embodiments of the present disclosure provide a display substrate including a nano pattern. For example, the display substrate is a display substrate in a thin film transistor liquid crystal display (TFT-LCD) or an organic light-emitting diode (OLED) display device. For example, a nano pattern in the TFT-LCD is one of a gate line pattern including a plurality of gate lines, a data line pattern including a plurality of data lines, an active layer pattern including a plurality of active layers, or a via hole pattern including a plurality of via holes, etc. For another example, a nano pattern in the OLED display device is one of a gate line pattern including a plurality of gate lines, a data line pattern including a plurality of data lines, an active layer pattern including a plurality of active layers, an electrode pattern including a plurality of electrodes, or a pixel defining layer pattern, etc.

Some other embodiments of the present disclosure provide a nanoimprint substrate including a nano pattern. The nanoimprint substrate may be used as a nano grating of a polarizer, or a large-sized imprint template for manufacturing a nanoimprint pattern.

At present, nanoimprint substrates are mainly manufactured by electron beam direct writing, laser direct writing, laser interference and other methods, and the manufactured nanoimprint templates are small in size.

In order to manufacture a large-sized nanoimprint substrate including a nano pattern, in some embodiments of the present disclosure, a large-sized imprint template is manufactured by using a small-sized nano-imprint template for multiple imprinting. Additionally, in order to form the nano pattern in a large-sized display substrate, in some embodiments of the present disclosure, the required nano pattern is formed by using a small-sized nanoimprint template for multiple imprinting on a base of the display substrate.

Based on this, some embodiments of the present disclosure provide a method for manufacturing a nano pattern, which may be used to manufacture the above nanoimprint substrate, or directly manufacture the required nano pattern on a base of the display substrate. The method includes S10 and S20.

Figure 2A:
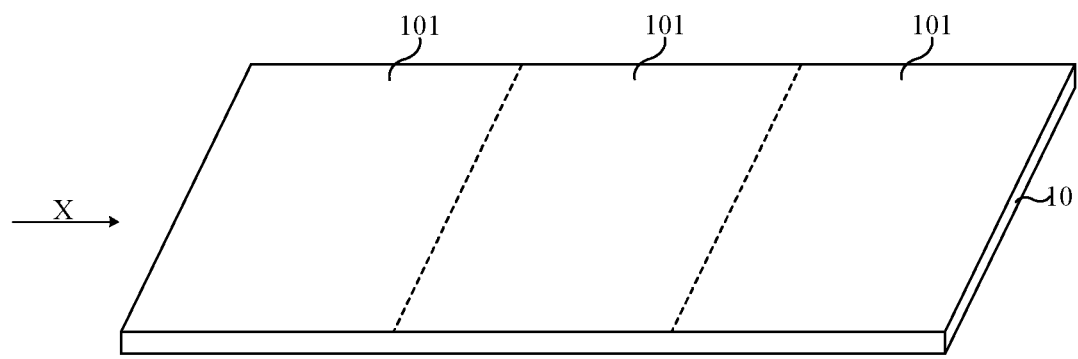
FIG. 2A is a diagram showing a distribution structure of imprint regions of a base substrate, in accordance with some embodiments.
Figure 2B:
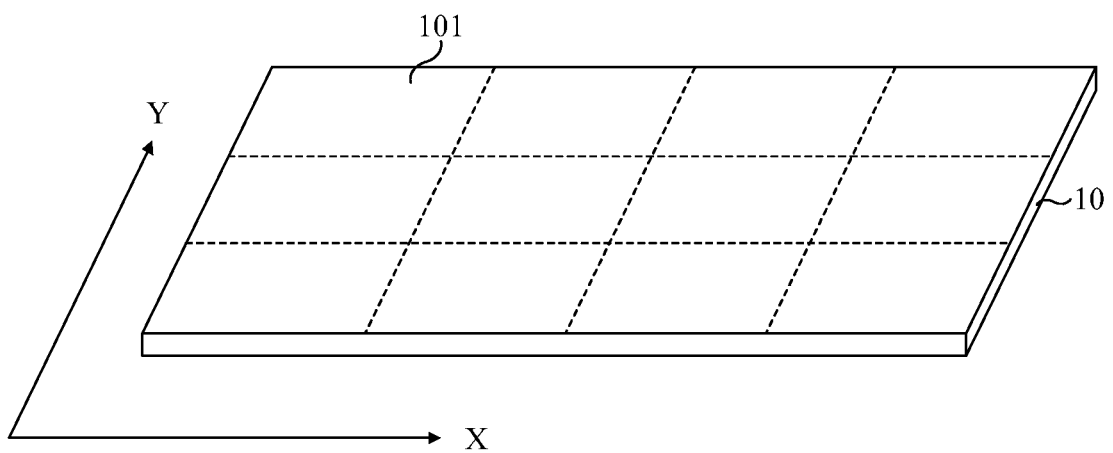
FIG. 2B is a diagram showing another distribution structure of imprint regions of a to base substrate, in accordance with some embodiments.

In S10, as shown in FIG. 1, a pattern transfer layer 20 is formed on a base substrate 10, the pattern transfer layer 20 being used to form a required nano pattern. As shown in FIGS. 2A and 2B, the base substrate 10 has N imprint regions 101, and N is a positive integer greater than or equal to 2.

The N imprint regions 101 may be arranged following different arrangement rules according to a shape and a size of the required nano pattern to be formed as a whole. For example, as shown in FIG. 2A, the N imprint regions 101 are arranged in a first direction X (e.g., horizontal direction). FIG. 2A shows three imprint regions 101, but embodiments of the present disclosure are not limited thereto. The number of the imprint regions 101 may also be 2 or a positive integer greater than 3. For another example, as shown in FIG. 2B, the N imprint regions 101 are arranged in a plurality of rows and a plurality of columns in the first direction X and a second direction Y (for example, the first direction X is a row direction, and the second direction Y is a column direction). FIG. 2B shows the N imprint regions 101 arranged in 3 rows and 4 columns, but embodiments of the present disclosure are not limited to thereto. The N imprint regions 101 may also be arranged in 2 rows and 2 columns, or 3 rows and 3 columns, etc. For yet another example, the N imprint regions 101 may be arranged in an annular shape into an annular structure.

In some embodiments, in a case where the method provided in the present disclosure is used to manufacture the nanoimprint substrate, the base substrate 10 is a base configured to carry the nano pattern in the nanoimprint substrate. For example, the base substrate 10 is a glass substrate.

In some other embodiments, in a case where the method provided in the present disclosure is used to manufacture the nano pattern (such as the gate line pattern, or the data line pattern) on a base of the display substrate, the base substrate 10 is the base of the display substrate. For example, the base substrate 10 is a glass substrate. For another example, the base substrate 10 includes a glass substrate and a flexible substrate (a material of the flexible substrate is, for example, plastic) disposed on the glass substrate. The glass substrate is peeled off to obtain a flexible display substrate after manufacture of the display substrate is completed.

A material of the pattern transfer layer 20 may be determined according to actual needs. In some examples, the required nano pattern to be formed is a nano pattern in the display substrate. In this case, for example, for manufacturing the nano pattern such as the gate line pattern, the data line pattern in the display substrate, the material of the pattern transfer layer 20 includes a metal material such as aluminum (Al) or copper (Cu). For another example, for manufacturing the active layer pattern in the display substrate, the material of the pattern transfer layer 20 is a semiconductor material such as indium gallium zinc oxide (IGZO) or amorphous silicon (a-Si). For yet another example, for manufacturing the electrode pattern in the display substrate, the material of the pattern transfer layer 20 includes a transparent conductive material such as indium tin oxide (ITO) or indium zinc oxide (IZO). In some other examples, the required nano pattern to be formed is a nano pattern in the nanoimprint substrate. In this case, for manufacturing the nanoimprint substrate, the material of the pattern transfer layer 20 includes at least one of metal (such as Al), inorganic non-metal (such as silicon dioxide (SiO$_2$), silicon nitride (SiN$_x$) or a-Si) or organic compounds (such as an organic gel material).

Figure 3:
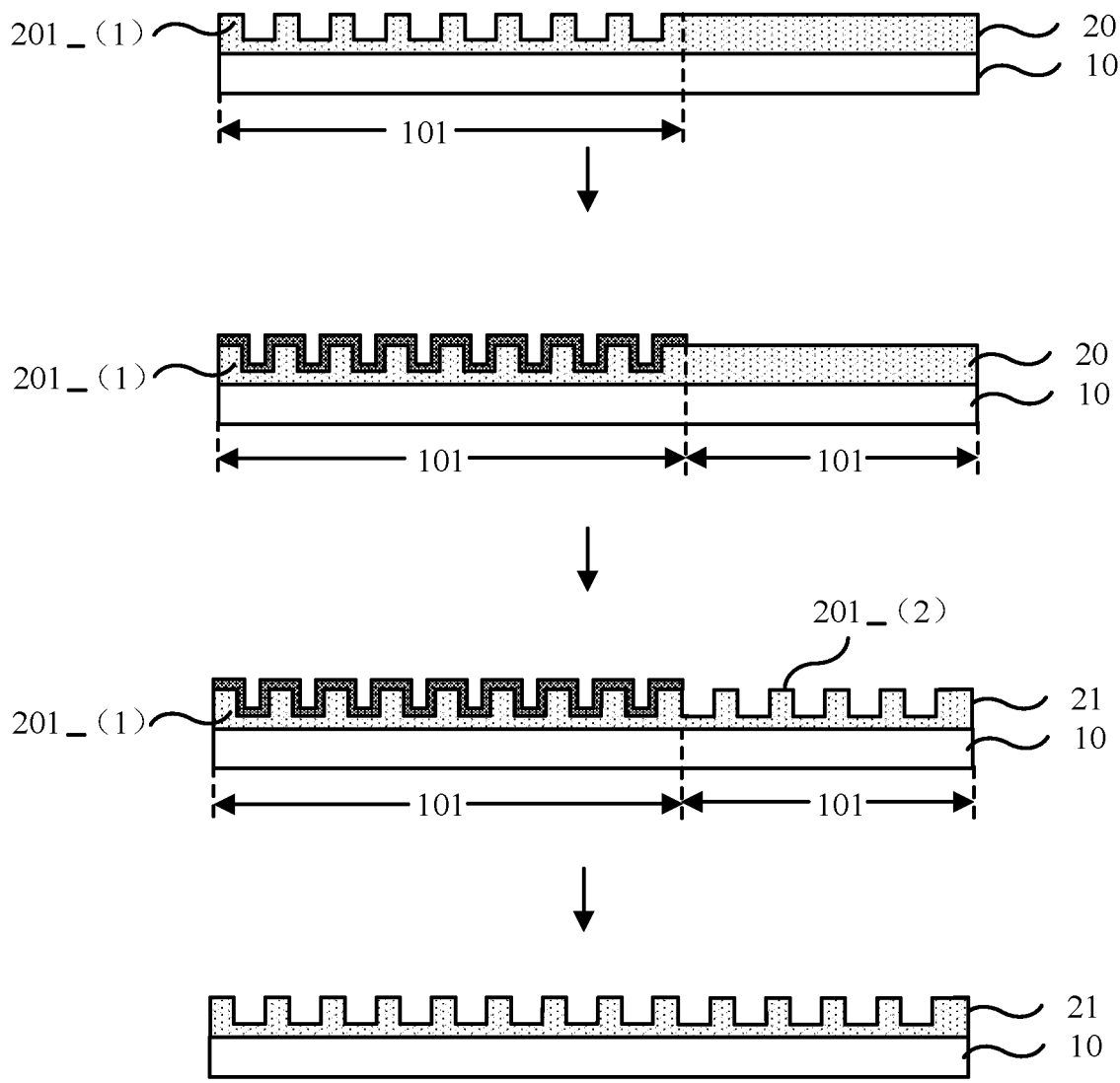
FIG. 3 is a schematic diagram of performing a plurality of patterning processes on a pattern transfer layer, in accordance with some embodiments.
Figure 4:
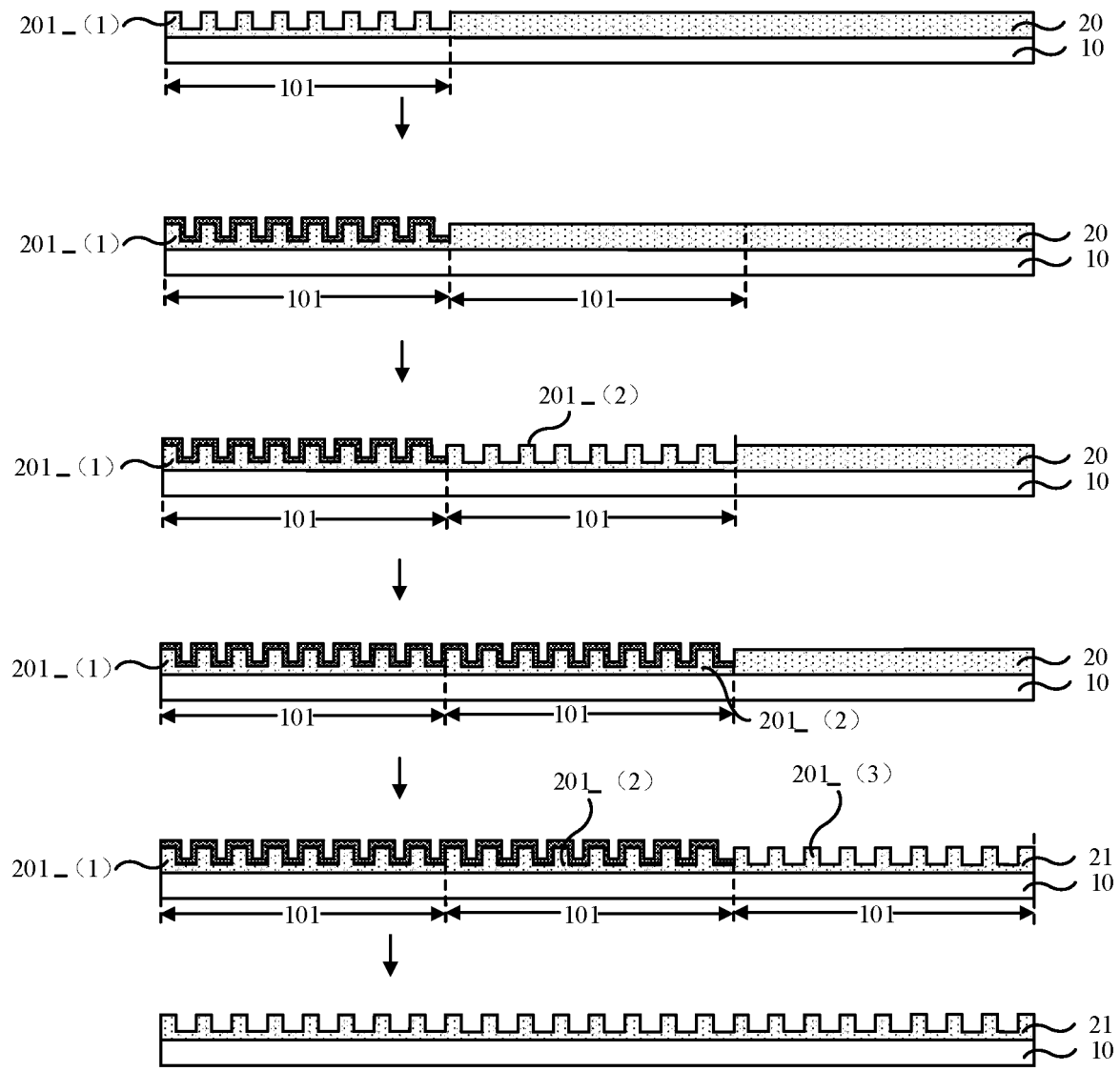
FIG. 4 is another schematic diagram of performing a plurality of patterning processes on a pattern transfer layer, in accordance with some embodiments.

In S20, as shown in FIGS. 3 and 4, a plurality of patterning processes are performed on the pattern transfer layer 20 to form an imprint pattern layer 21. A portion of the imprint pattern layer 21 located in each imprint region 101 is an imprint pattern 201, and N imprint patterns are formed in sequence.

That is, a first patterning process is performed on the pattern transfer layer 20 to form one imprint pattern 201 in one imprint region 101; and a second patterning process is performed on the pattern transfer layer 20 to form another imprint pattern 201 in another imprint region 101. In this way, the imprint pattern layer 21 including the N imprint patterns 201 is formed after the pattern transfer layer 20 is patterned N times. For example, as shown in FIG. 3, the first patterning process is performed on the pattern transfer layer 20 to form an imprint pattern 201_(1) in one imprint region 101; and the second patterning process is performed on the pattern transfer layer 20 to form another imprint pattern 201_(2) in another imprint region 101. For another example, as shown in FIG. 4, the first patterning process is performed on the pattern transfer layer 20 to form an imprint pattern 201_(1) in one imprint region 101; the second patterning process is performed on the pattern transfer layer 20 to form another imprint pattern 201_(2) in another imprint region 101; and a third patterning process is performed on the pattern transfer layer 20 to form yet another imprint pattern 201_(3) in yet another imprint region 101.

FIG. 2A shows an example in which the base substrate 10 has three imprint regions 101. One patterning process is performed on a portion, located in each of the three imprint regions 101, of the pattern transfer layer 20 in sequence in the first direction X. An imprint pattern 201 is formed in a corresponding imprint region 101 after a patterning process is performed every time. FIG. 2B shows an example in which the base substrate 10 have 3×4 imprint regions 101. The first direction X is the row direction, and the second direction Y is the column direction. One patterning process is performed on a portion, located in each of four imprint regions 101 of a first row, of the pattern transfer layer 20 in sequence from left to right. Then, one patterning process is performed on a portion, located in each of four imprint regions 101 of a second row, of the pattern transfer layer 20 in sequence from left to right. After that, one patterning process is performed on a portion, located in each of four imprint regions 101 of a third row, of the pattern transfer layer 20 in sequence from left to right. An imprint pattern 201 is formed in a corresponding imprint region 101 after a patterning process is performed every time. For another example, as shown in FIG. 2B, the first direction X is the row direction, and the second direction Y is the column direction. One patterning process is performed on a portion, located in each of three imprint regions 101 of a first column, of the pattern transfer layer 20 in sequence from top to bottom. Then, one patterning process is performed on a portion, located in each of three imprint regions 101 of a second column, of the pattern transfer layer 20 in sequence from top to bottom. Then, one patterning process is performed on a portion, located in each of three imprint regions 101 of a third column, of the pattern transfer layer 20 in sequence from top to bottom. After that, one patterning process is performed on a portion, located in each of three imprint regions 101 of a fourth column, of the pattern transfer layer 20 in sequence from top to bottom. An imprint pattern 201 is formed in a corresponding imprint region 101 after a patterning process is performed every time.

Based on the above, forming an i-th imprint pattern 201_(i) in an i-th imprint region 101_(i) (i being an integer greater than or equal to 1 and less than or equal to (N−1) (1≤i≤N−1)) includes S201 to S203. It can be noted that in a case where N is greater than 3, each of a first imprint pattern 201_(1), a second imprint pattern 201_(2) to an (N−1)-th imprint pattern 201_(N−1) is formed through S201 to S203. In addition, in a case where N is equal to 2, a value of i is 1. In a case where N is equal to 3, the value of i may be 1 or 2. That is, both the first imprint pattern 201_(1) and the second imprint pattern 201_(2) are formed through S201 to S203.

Figure 5:
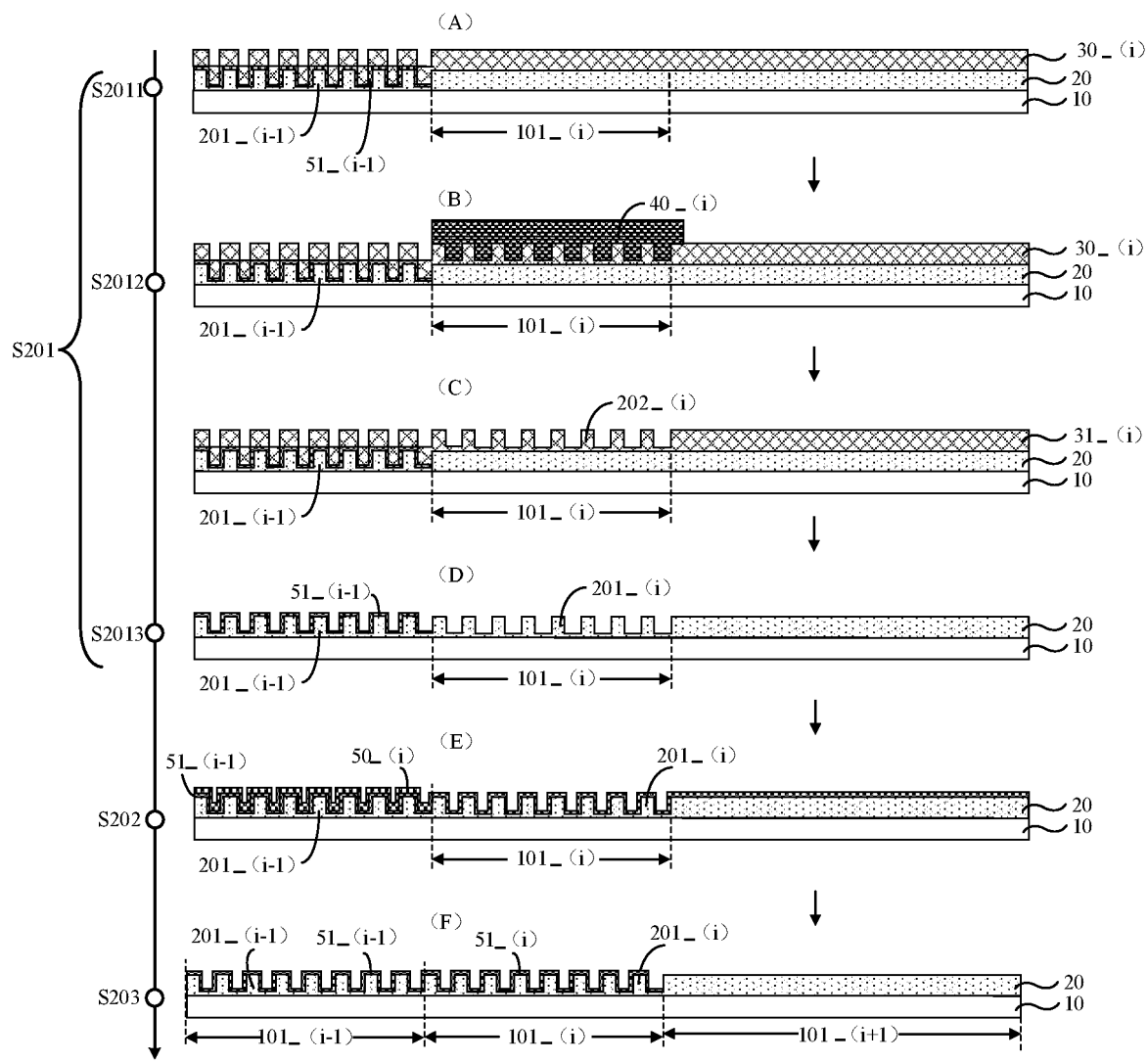
FIG. 5 is a schematic diagram of forming an i-th imprint pattern, in accordance with some embodiments.

In S201, as shown in (A) to (D) of FIG. 5, one patterning process is performed on a portion of the pattern transfer layer 20 located in the i-th imprint region 101_(i) to form an i-th imprint pattern 201_(i).

Performing the patterning process on the portion of the pattern transfer layer 20 located in the i-th imprint region 101_(i) may be achieved through an imprint process and an etching process.

In some examples, performing the patterning process on the portion of the pattern transfer layer 20 located in the i-th imprint region 101_(i) to form the i-th imprint pattern 201_(i) includes S2011 to S2013.

In S2011, as shown in (A) of FIG. 5, an i-th adhesive layer 30_(i) is formed on a side of the pattern transfer layer 20 away from the base substrate 10.

In some examples, a material of the i-th adhesive layer 30_(i) includes an imprint adhesive. The imprint adhesive may be a hot imprint adhesive or an ultraviolet imprint adhesive. A method for forming the i-th adhesive layer 30_(i) on the pattern transfer layer 20 may be spin coating, roll coating, dripping, spraying or the like.

In S2012, as shown in (B) and (C) of FIG. 5, the i-th adhesive layer 30_(i) is imprinted to obtain an i-th imprinted adhesive layer 31_(i), the i-th imprinted adhesive layer 31_(i) including an i-th pattern 202_(i) to be transferred located in the i-th imprint region 101_(i).

Herein, an imprint template 40_(i) may be used to imprint the i-th adhesive layer 30_(i) to obtain the i-th imprinted adhesive layer 31_(i). During the imprint process, the imprint template 40_(i) prepared in advance is aligned with and pressed onto a portion of the i-th adhesive layer 30_(i) which needs to be imprinted, so that the imprint adhesive gradually fills a micro-nano structure of the imprint template 40_(i). Subsequently, the imprint adhesive is cured through a different curing method according to different materials of the imprint adhesive. For example, in a case where the imprint adhesive is the hot imprint adhesive, the imprint adhesive is cured by heating. For another example, in a case where the imprint adhesive is the ultraviolet imprint adhesive, the imprint adhesive is cured through ultraviolet light irradiation. Subsequently, as shown in (C) of FIG. 5, the imprint template 40_(i) is separated from the i-th adhesive layer 30_(i) to obtain the i-th imprinted adhesive layer 31_(i) including the i-th pattern 202_(i) to be transferred.

A size of the imprint template 40_(i) is not limited in the embodiments of the present disclosure. In some examples, the imprint template 40_(i) is a small size template with the size such as 4 inches, 6 inches, 8 inches, or 12 inches.

For example, the imprint template 40_(i) used in each patterning process is the same. Alternatively, the plurality of patterning processes may also be implemented by using different imprint templates.

In S2013, as shown in (C) and (D) of FIG. 5, the portion of the pattern transfer layer 20 located in the i-th imprint region 101_(i) is etched to form the i-th imprint pattern 201_(i) corresponding to the i-th pattern 202_(i) to be transferred.

Herein, the i-th imprint pattern 201_(i) corresponds to the i-th pattern 202_(i) to be transferred, which means that a shape of the i-th imprint pattern 201_(i) is the same as a shape of the i-th pattern 202_(i) to be transferred. That is, a process of etching the portion of the pattern transfer layer 20 located in the i-th imprint region 101_(i) is a process of transferring the shape of the i-th pattern 202_(i) to be transferred to the pattern transfer layer 20.

Herein, during the process of forming the i-th imprint pattern 201_(i) corresponding to the i-th pattern 202_(i) to be transferred through the etching process, the i-th imprinted adhesive layer 31_(i) is also removed by etching.

For example, as shown in (C) of FIG. 5, the i-th pattern 202_(i) to be transferred includes a thin portion and a thick portion, and a thickness of the thick portion is the same as a thickness of a portion of the i-th imprinted adhesive layer 31_(i) other than the i-th pattern 202_(i) to be transferred. An etching speed at each position of the i-th imprinted adhesive layer 31_(i) is approximately the same in the etching process. A thin portion of the i-th imprinted adhesive layer 31_(i) is firstly removed by etching, so that a portion of the pattern transfer layer 20 below the i-th pattern 202_(1) to be transferred (i.e., a portion, located in the i-th imprint region 101_(i) and contacting the thin portion of the i-th pattern 202_(i) to be transferred, of the pattern transfer layer 20) is exposed. As the etching is performed, to as shown in (D) of FIG. 5, the exposed portion of the pattern transfer layer 20 and a remaining portion of the i-th imprinted adhesive layer 31_(i) other than the thin portion of the i-th pattern 202_(i) to be transferred are simultaneously etched. As a result, the i-th pattern 202_(i) to be transferred is gradually transferred to the pattern transfer layer 20 until the portion of the pattern transfer layer 20 below the i-th pattern 202_(i) to be transferred (i.e., the portion of the pattern transfer layer 20 located in the i-th imprint region 101_(i)) forms the i-th imprint pattern 201_(i). When the i-th imprint pattern 201_(i) is formed, the i-th imprinted adhesive layer 31_(i) is also removed by etching.

For example, the material of the pattern transfer layer 20 includes an organic material or one of inorganic non-metallic materials such as $SiN_x$, $SiO_2$ or a-Si. In this case, the etching process uses dry etching. For another example, the material of the pattern transfer layer 20 includes at least one of a metal material such as Al, Cu, or a metal oxide material such as ITO, IGZO, and the etching process uses wet etching.

It can be noted that FIG. 5 shows an example in which the second imprint pattern 201_(2) or a j-th imprint pattern 201_(j) (j being an integer greater than or equal to 3) is formed. That is, FIG. 5 shows an example in which the value of i is not 1. In a case where the value of i is 1, the process of forming the first imprint pattern 201_(1) is similar to the process of forming the second imprint pattern 201_(2) or forming the j-th imprint pattern 201_(j).

Figure 6:
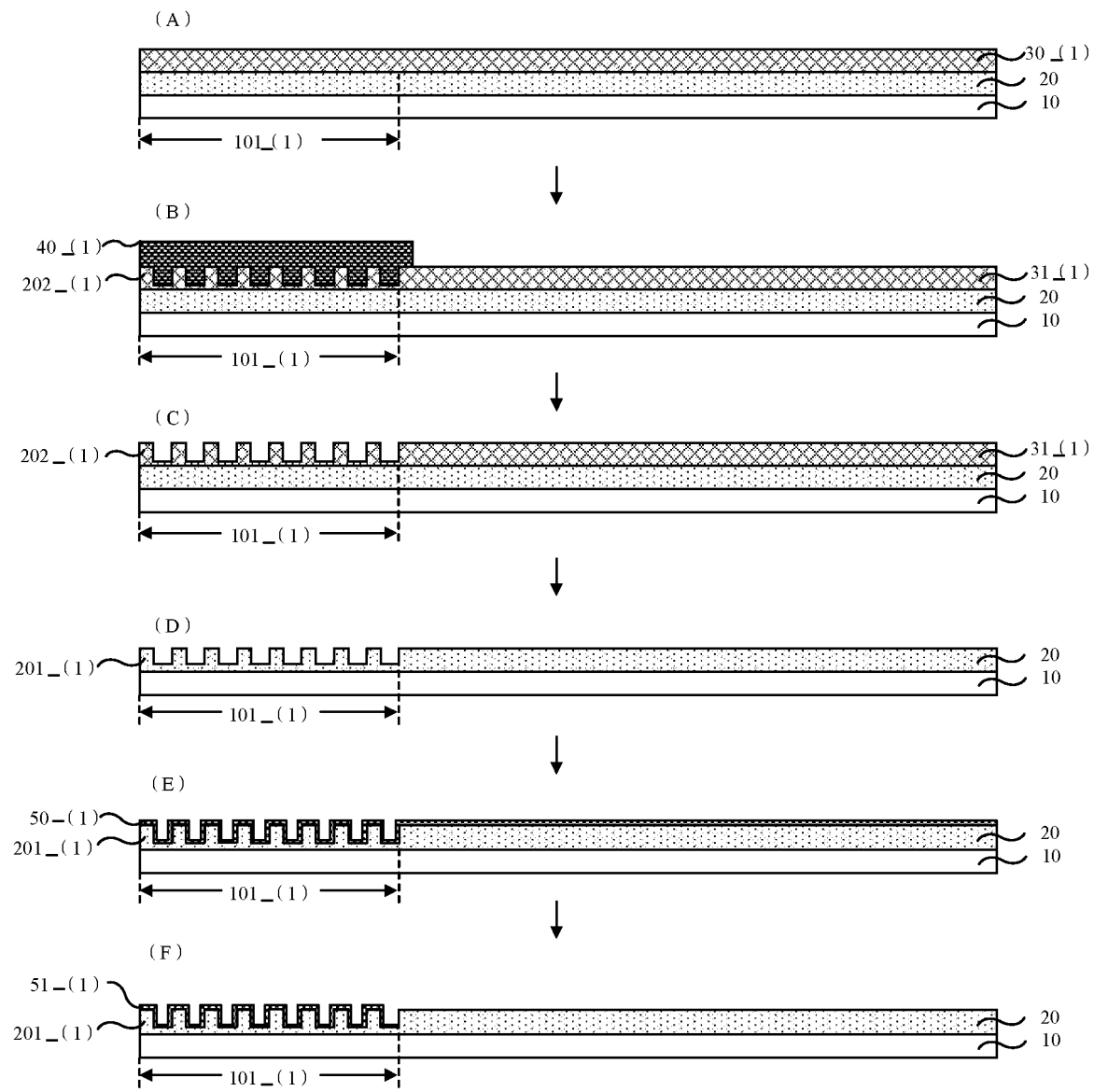
FIG. 6 is a schematic diagram of forming a first imprint pattern, in accordance with some embodiments.

FIG. 6 shows the process of forming the first imprint pattern 201_(1). As shown in (A) of FIG. 6, a first adhesive layer 30_(1) is formed on the side of the pattern transfer layer 20 away from the base substrate 10. As shown in (B) and (C) of FIG. 6, the first adhesive layer 30_(1) is imprinted by using a print template 40_(1) to obtain a first imprinted adhesive layer 31_(1) including a first pattern 202_(1) to be transferred located in a first print region 101_(1). As shown in (D) of FIG. 6, a portion of the pattern transfer layer 20 located in the first imprint region 101_(1) is etched to form the first imprint pattern 201_(1) corresponding to the first pattern 202_(1) to be transferred.

In S202, as shown in (E) of FIG. 5, an i-th protective film 50_(i) is formed on the side of the pattern transfer layer 20 away from the base substrate 10.

Considering the formation of the first imprint pattern 201_(1) in S201 as an example, as shown in the (E) of FIG. 6, a first protective film 50_(1) is formed in S202. Considering the formation of the second imprint pattern 201_(2) or the j-th imprint pattern 201_0) in S201 as an example, as shown in the (E) of FIG. 5, the i-th protective film 50_(i) is formed in S202, where i is equal to 2 or j.

In some embodiments, a thickness of the i-th protective film 50_(i) is 20 nm to 100 nm. For example, the thickness of the i-th protective film 50_(i) is 20 nm, 30 nm, 40 nm, 50 nm, 60 nm, 70 nm, 80 nm, 90 nm, or 100 nm.

In this way, difficulty of film formation may be reduced, the imprint patterns may be effectively protected, and furthermore a height difference may be prevented from being formed at edges of adjacent imprint regions to ensure imprint accuracy.

In S203, as shown in (F) of FIG. 5, at least a portion of the i-th protective film 50_(i) located in an (i+1)-th imprint region 101_(i+1) is removed, so as to obtain an i-th protective layer 51_(i) and expose a portion of the pattern transfer layer 20 located in the (i+1)-th imprint region 101_(i+1). The i-th protective layer 51_(i) is located at least in the i-th imprint region 101_(i).

The i-th protective layer 51_(i) is configured to protect the i-th imprint pattern 201_(i) formed in S201 from being damaged in other subsequent patterning processes.

An (i+1)-th imprint pattern needs to be formed in the (i+1)-th imprint region 101_(i+1) after the i-th imprint pattern 201_(i) is formed in the i-th imprint region 101_(i). Therefore, it needs to be ensured that the portion of the pattern transfer layer 20 located in the (i+1)-th imprint region 101_(i+1) is completely exposed, and is not covered by any one of the first protective layer 51_(1) to the protective layer 51_(i) after the i-th protective layer 51_(i) is formed in S203.

In a case where the value of i is 1, as shown in (F) of FIG. 6, the first protective layer 51_(1) may only be located in the first imprint region 101_(1), and a portion of the pattern transfer layer 20 other than the portion located in the first imprint region 101_(1) is exposed. Alternatively, the first protective layer 51_(1) may also be located in remaining imprint regions other than the second imprint region 101_(2). That is, the first protective layer 51_(1) only exposes a portion of the pattern transfer layer 20 located in the second imprint region 101_(2).

In a case where the value of i is 2 or j, as shown in (F) of FIG. 5, the i-th protective layer 51_(i) may only be located in the i-th imprint region 101_(1) to protect the i-th imprint pattern 201_(i). It can be noted here that if at least one protective layer that has been formed includes a portion located in the (i+1)-th imprint region 101_(i+1), the portion of the at least one protective layer located in the (i+1)-th imprint region 101_(i+1) also needs to be removed in the process of removing the portion of the i-th protective film 50_(i) located in the (i+1)-th imprint region 101_(i+1). For example, in a case where the value of i is 2, if the formed first protective layer 51_(1) is located in remaining imprint regions other than the second imprint region 101_(2), a portion of the first protective layer 51_(1) located in a third imprint region 101_(3) needs to be removed in a process of forming a second protective layer 51_(2), so as to ensure that a portion of the pattern transfer layer 20 located in the third imprint region 101_(3) is completely exposed. Alternatively, the i-th protective layer 51_(i) may also be located in remaining imprint regions other than the (i+1)-th imprint region 101_(i+1). In this case, a surface of each of the first imprint pattern 201_(1) to the i-th imprint pattern 201_(i−1) may be covered by a plurality of protective layers in a stack manner.

In a word, after at least the portion of the i-th protective layer 50_(i) located in the (i+1)-th imprint region 101_(i+1) is removed and before the portion of the pattern transfer layer 20 located in the (i+1)-th imprint region 101_(i+1) is patterned, each imprint pattern formed in the pattern transfer layer 20 is covered by at least one protective layer. It can be noted that, when the (i+1)-th imprint pattern 201_(i+1) is formed, imprint pattern(s) previously formed are covered by at least one of the first protective layer to i-th protective layer. In this way, due to the protection of the protective layers, the imprint process and the etching process for etching the pattern transfer layer 20 will not damage the imprint pattern(s) that have been formed. Additionally, alignment difficulty in the imprint process may also be reduced.

Figure 7A:
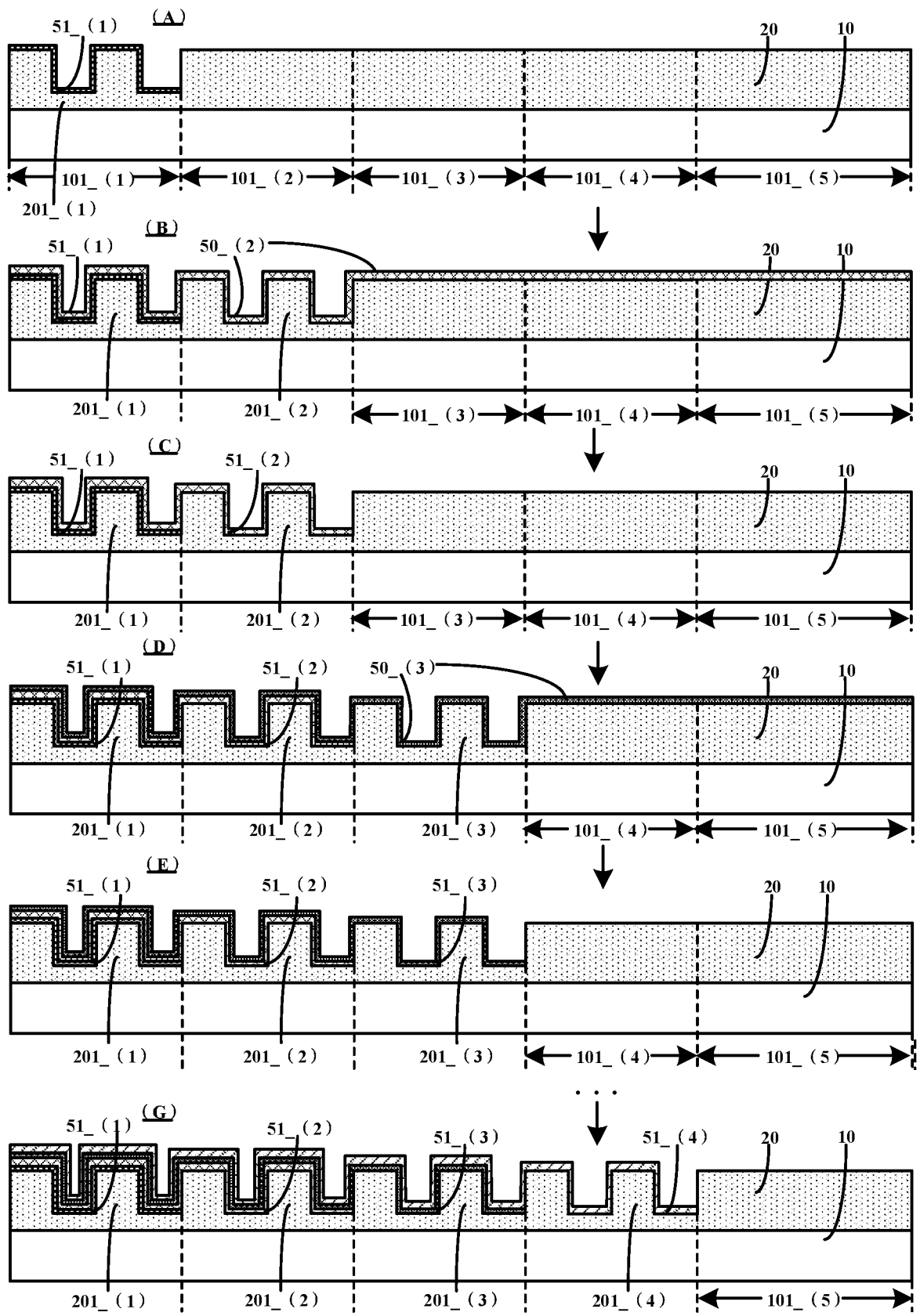
FIG. 7A is a schematic diagram of forming an i-th protective layer, in accordance with some embodiments.

In some examples, a portion, located in imprint regions of the pattern transfer layer 20 which have not been patterned, of the i-th protective film 50_(i) is removed in S203, so that the formed i-th protective layer 51_(i) covers the first imprint pattern to the i-th imprint pattern. For example, N is equal to 5. As shown in FIG. 7A, the first protective layer 51_(1) is located only in the first imprint region 101_(1) and covers the first imprint pattern 201_(1). The second protective layer 51_(2) is located in the first imprint region 101_(1) and the second imprint region 101_(2), and covers the first imprint pattern 201_(1) and the second imprint pattern 201_(2). A third protective layer 51_(3) is located in the first imprint region 101_(1), the second imprint region 101_(2) and the third imprint region 101_(3), and covers the first imprint pattern 201_(1), the second imprint pattern 201_(2) and the third imprint pattern 201_(3). A fourth protective layer 51_(4) is located in the first imprint region 101_(1), the second imprint region 101_(2), the third imprint region 101_(3) and a fourth imprint region 101_(4), and covers the first imprint pattern 201_(1), the second imprint pattern 201_(2), the third imprint pattern 201_(3) and a fourth imprint pattern 201_(4).

In this case, as shown in FIG. 7A, in the case where the value of i is 2 or j, after the i-th imprint pattern 201_(i) is formed in the i-th imprint region 101_(i) in S201 and when S203 is performed, only the portion of the i-th protective film 50_(i) located in the imprint regions of the pattern transfer layer 20 which have not been patterned needs to be removed.

Figure 7B:
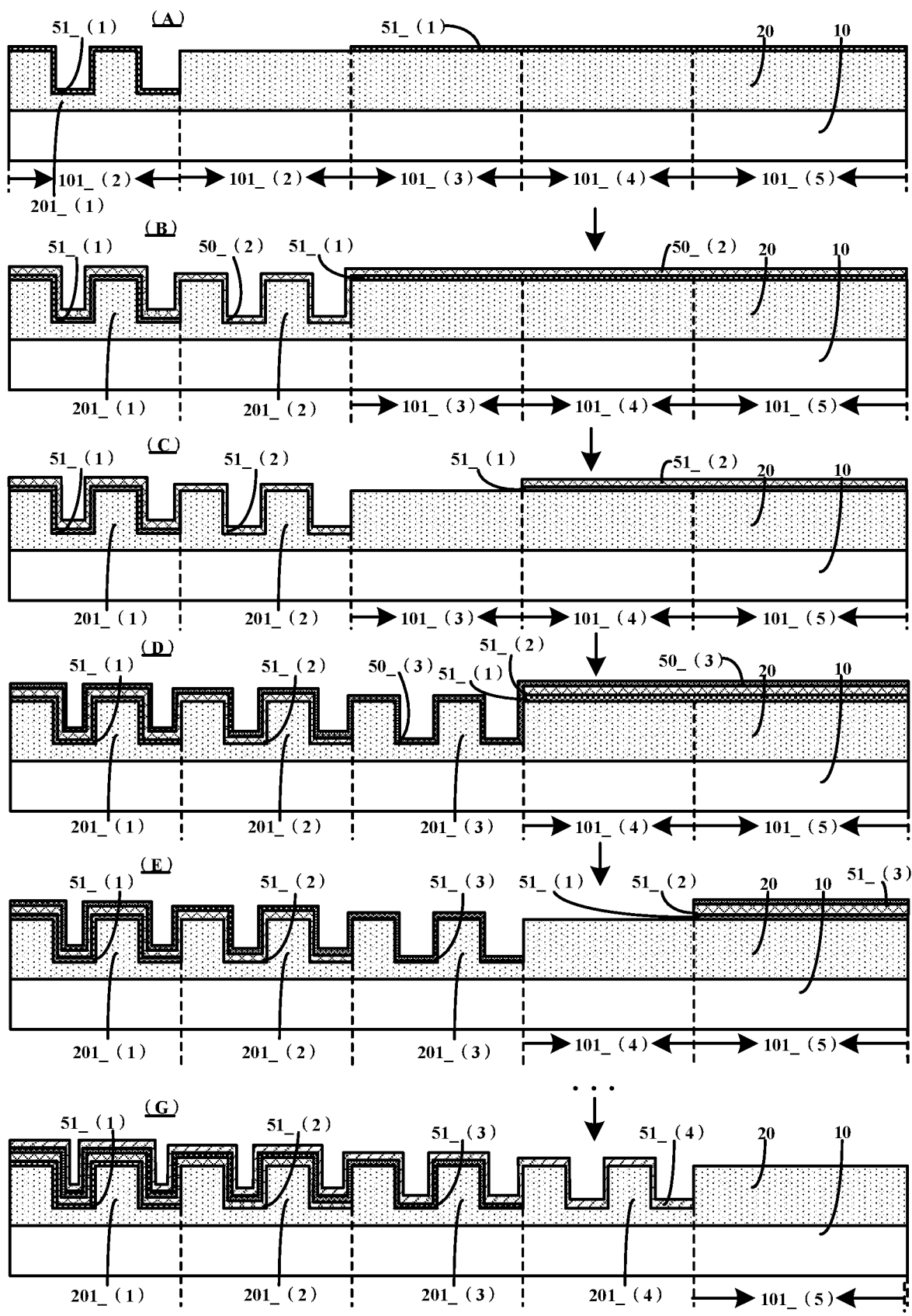
FIG. 7B is another schematic diagram of forming an i-th protective layer, in accordance with some embodiments.

In some other examples, only the portion of the the i-th protective film 50_(i) located in the (i+1)-th imprint region 101_(i+1) is removed in S203, so that the formed i-th protective layer 51_(i) has an opening. An orthogonal projection of the opening on the base substrate 10 overlaps the (i+1)-th imprint region 101_(i+1). In other words, the i-th protective layer 51_(i) only exposes the portion of the pattern transfer layer 20 located in the (i+1)-th imprint region 101_(i+1). For example, N is equal to 5. As shown in FIG. 7B, the first protective layer 51_(1) covers the first imprint pattern 201_(1) and portions of the pattern transfer layer 20 located in the third imprint region 101_(3), the fourth imprint region 101_(4) and a fifth imprint region 101_(5). The second protective layer 51_(2) covers the first imprint pattern 201_(1) and the second imprint pattern 201_(2) and portions of the pattern transfer layer 20 located in the fourth imprint region 101_(4) and the fifth imprint region 101_(5). The third protective layer 51_(3) covers the first imprint pattern 201_(1), the second imprint pattern 201_(2) and the third imprint pattern 201_(3) and a portion of the pattern transfer layer 20 located in the fifth imprint region 101_(5). The fourth protective layer 51_(4) covers the first imprint pattern 201_(1), the second imprint pattern 201_(2), the third imprint pattern 201_(3) and the fourth imprint pattern 201_(4).

In this case, in the case where the value of i is 2 or j, as shown in (B), (D), and (G) of FIG. 7B, after the i-th imprint pattern 201_(i) is formed in the i-th imprint region 101_(i) in S201 and before S203 is performed, the portion of the pattern transfer layer 20 located in the (i+1)-th imprint region 101_(i+1) is covered by the first protective layer to the (i−1)-th protective layer and the i-th protective film 50_(i) in sequence from bottom to top. Therefore, when the portion of the i-th protective film 50_(i) located in the (i+1)-th imprint region 101_(i+1) is removed in S203, portion(s) of the first protective layer to (i−1)-th protective layer located in the (i+1)-th imprint region 101_(i+1) are also removed, so as to expose the portion of the pattern transfer layer 20 located in the (i+1)-th imprint region 101_(i+1).

Figure 7C:
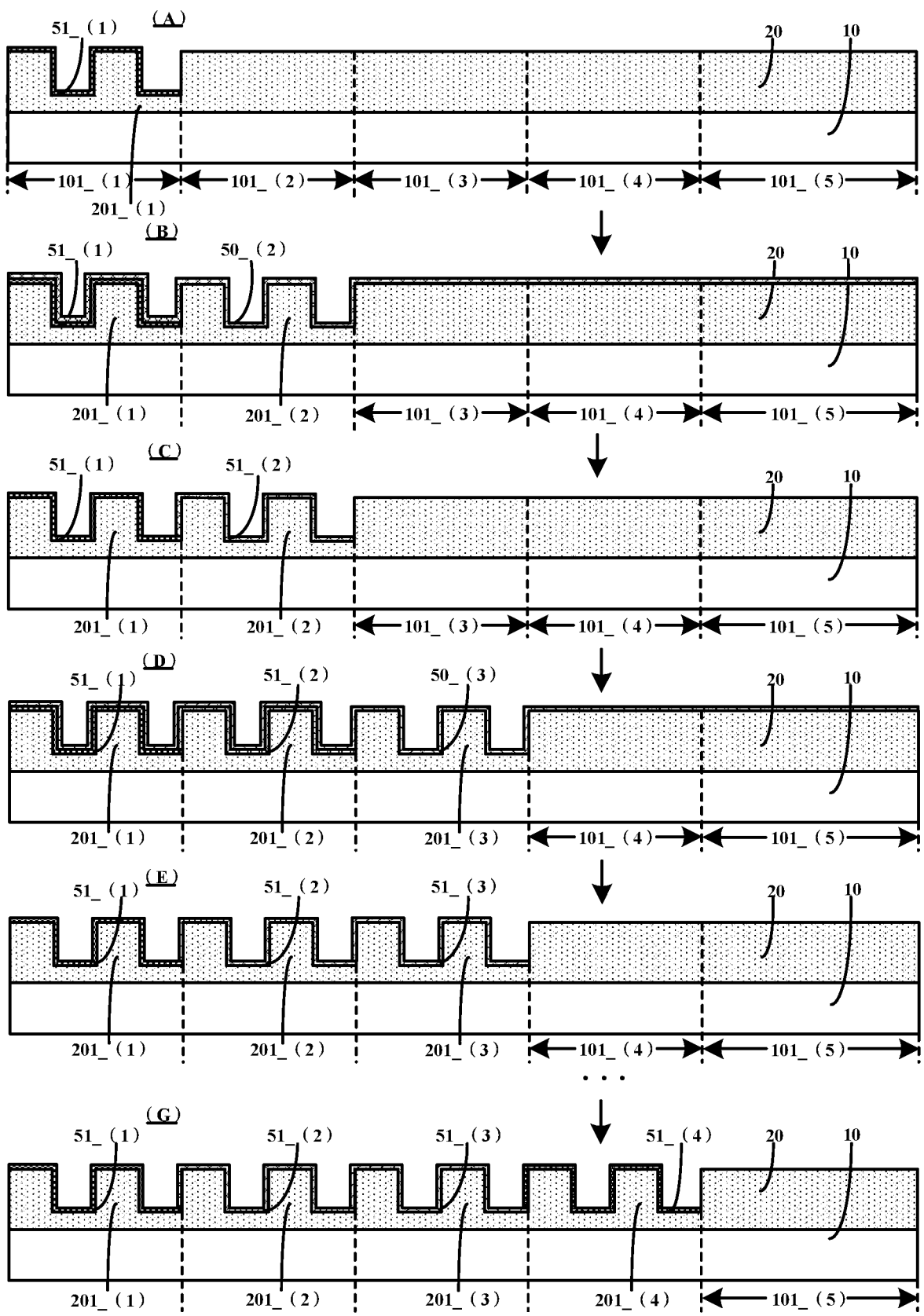
FIG. 7C is yet another schematic diagram of forming an i-th protective layer, in accordance with some embodiments.

In yet some other examples, only a portion of the i-th protective film 50_(i) located in the i-th imprint region 101_(1) is retained in S203. That is, a remaining portion of the i-th protective film 50_(i) other than the portion thereof located in the i-th imprint region 101_(1) is removed, so that the formed i-th protective layer 51_(i) only covers the i-th imprint pattern 201_(i). For example, N is equal to 5. As shown in FIG. 7C, the first protective layer 51_(1) only covers the first imprint pattern 201_(1); the second protective layer 51_(2) only covers the second imprint pattern 201_(2); the third protective layer 51_(3) only covers the third imprint pattern 201_(3); and the fourth protective layer 51_(4) only covers the fourth imprint pattern 201_(4).

In this case, in the case where the value of i is 2 or j, as shown in (B), (C), (D) and (E) of FIG. 7C, after the i-th imprint pattern 201_(i) is formed in the i-th imprint region 101_(1) in S201 and when S203 is performed, only the remaining portion of the i-th protective film 50_(i) other than the portion thereof located in the i-th imprint region 101_(1) needs to be removed.

For example, thicknesses of any two of the first protective layer to the i-th protective layer are equal.

In S203, removing at least the portion of the i-th protective film 50_(i) located in the (i+1)-th imprint region 101_(i+1) (i.e., patterning the i-th protective film 50_(i)) may be achieved through a photolithography process including exposure, development and etching process.

Figure 8:
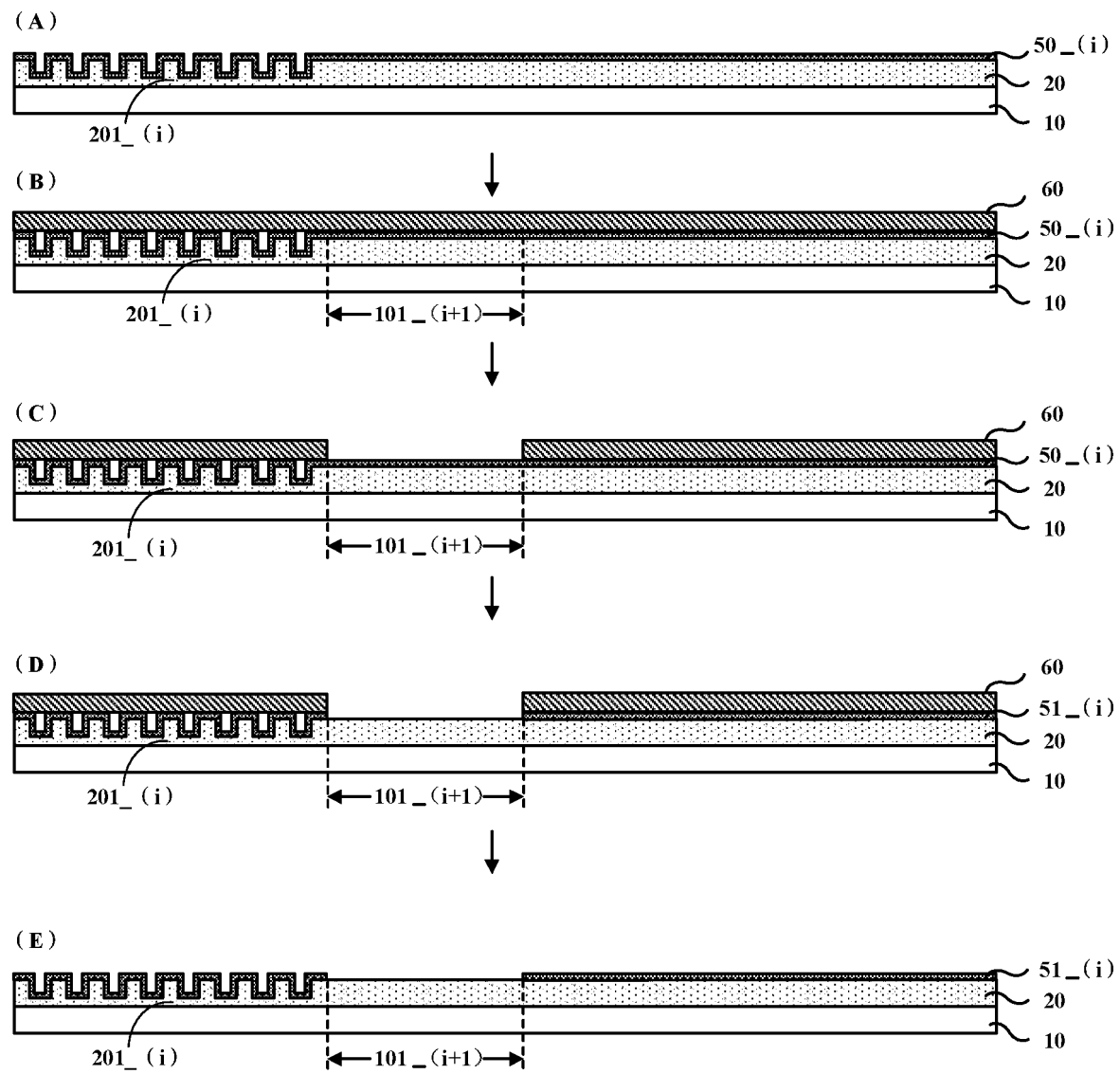
FIG. 8 is a schematic diagram of a photolithography process for forming an i-th protective layer by using an i-th protective film, in accordance with some embodiments.
Figure 9:
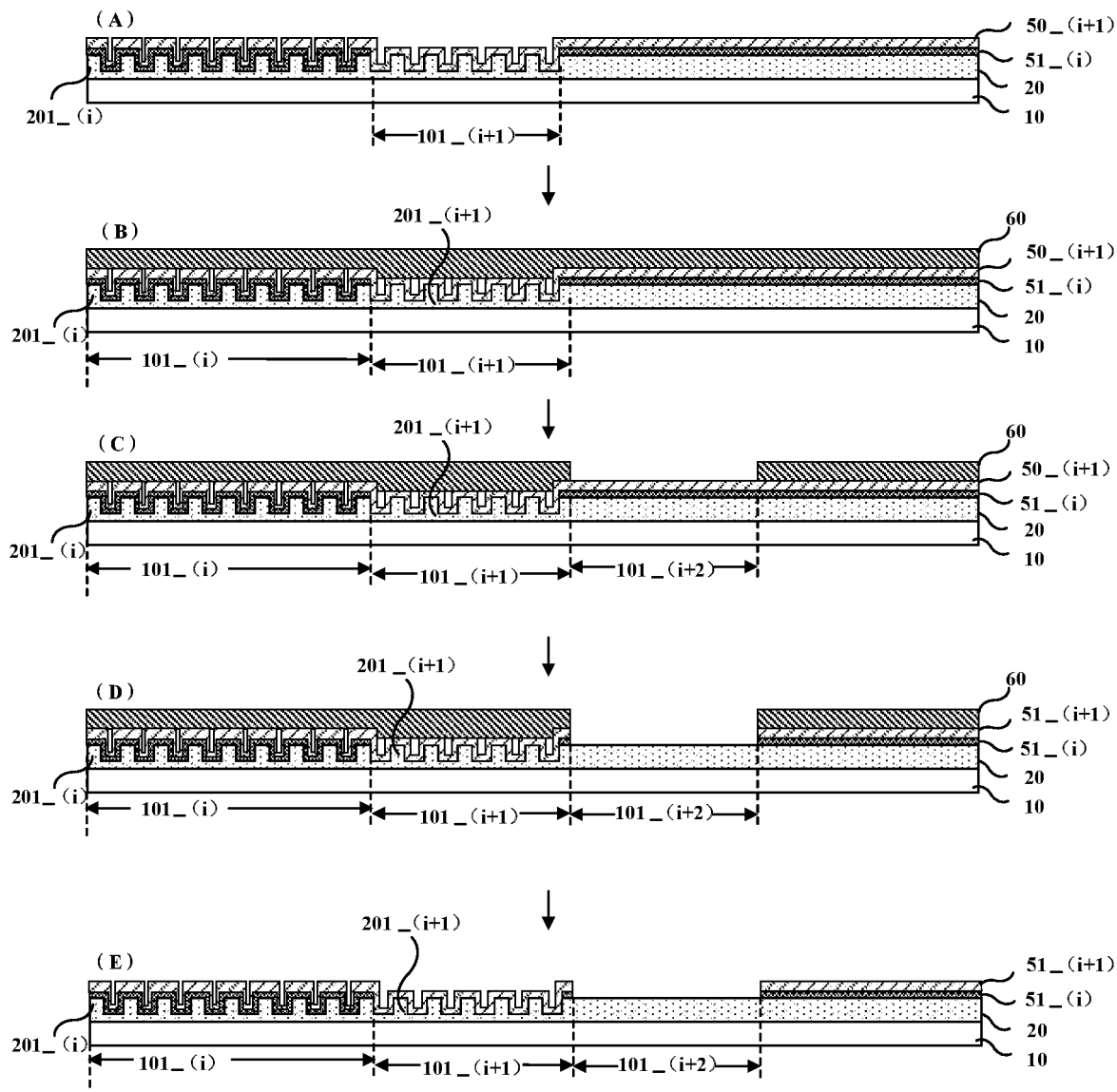
FIG. 9 is a schematic diagram of etching an (i+1)-th protective film and protective layers thereunder, in accordance with some embodiments.

For example, the i-th protective layer 51_(i) has the opening and the orthogonal projection of the opening on the base substrate 10 overlaps the (i+1)-th imprint region 101_(i+1). As shown in (B) of FIG. 8, the i-th protective film 50_(i) is coated with a photoresist 60 first. As shown in (C) of FIG. 8, the photoresist 60 is next exposed and developed, so as to remove a portion of the photoresist 60 located in the (i+1)-th imprint region 101_(i+1). As shown in (D) of FIG. 8, a portion of the i-th protective film 50_(i) which is not covered by a remaining portion of the photoresist 60 is next removed, so as to expose the portion of the pattern transfer layer 20 located in the (i+1)-th imprint region 101_(i+1). As shown in (E) of FIG. 8, the remaining portion of the photoresist 60 is finally peeled off. It can be noted that FIG. 9 shows an example in which the (i+1)-th protective film 50_(i+1) is etched. Since a portion of the pattern transfer layer 20 located in an (i+2)-th imprint region 101_(i+2) is covered by the (i+1)-th protective film 50_(i+1) and the i-th protective layer 51_(i), a portion of the i-th protective layer 51_(i) located in the (i+2)-th imprint region 101_(i+2) is also removed during the process of etching the (i+1)-th protective film 50_(i+1).

At least the portion of the i-th protective film 50_(i) located in the (i+1)-th imprint region 101_(i+1) is removed through the photolithography process, so that the region of the pattern transfer layer 20 that needs to be exposed may have high dimensional accuracy, and further demarcation of each imprint region may be accurate. In this way, the precision of the nano pattern may be improved.

The accuracy of patterning the i-th protective film 50_(i) which depends on overlay accuracy of an exposure machine may reach below 1 μm, or even hundred-nanometer scale. Correspondingly, accuracy of splicing imprint patterns 201 located in different imprint regions 101 may reach below 1 μm, or even the hundred-nanometer scale.

In some embodiments, forming an N-th imprint pattern in an N-th imprint region includes S204 and S205.

Figure 10:
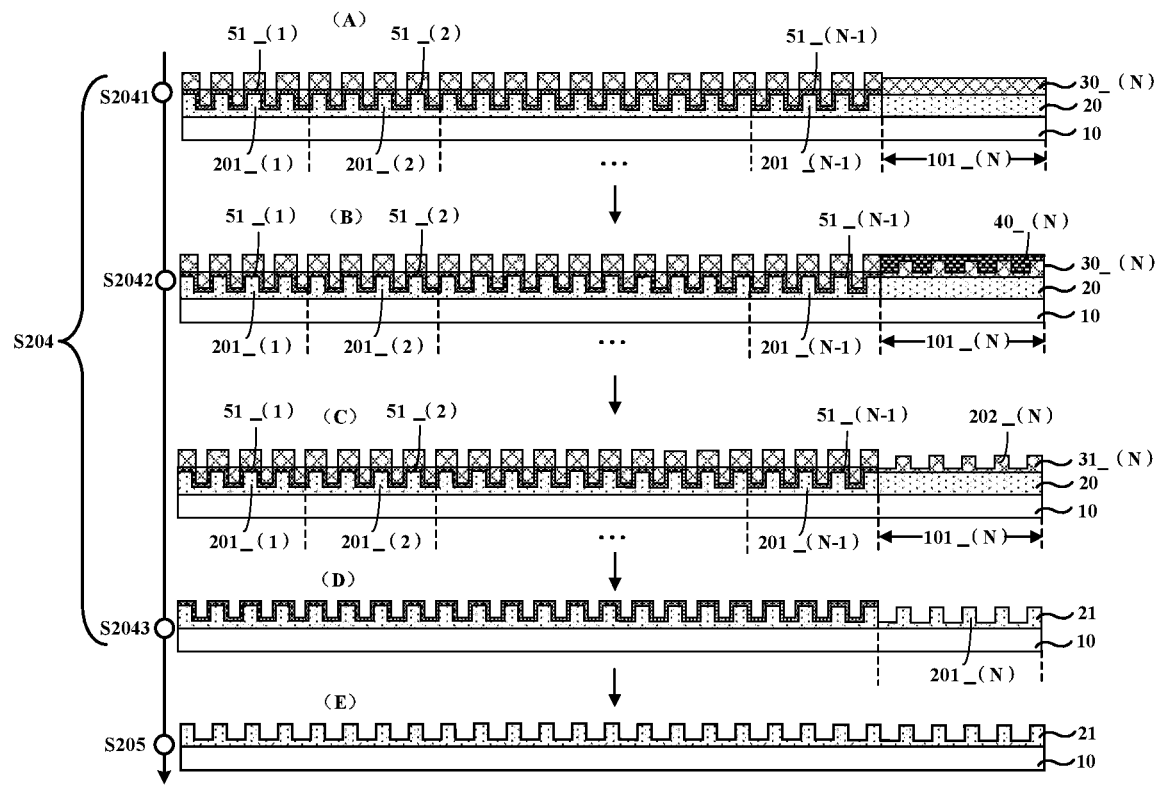
FIG. 10 is a schematic diagram of forming an N-th imprint pattern, in accordance with some embodiments.

In S204, as shown in (A) to (D) of FIG. 10, a portion of the pattern transfer layer 20 located in the N-th imprint region 101_(N) is patterned, so as to form an N-th imprint pattern 201_(N). In this case, the imprint pattern layer 21 is formed.

In S205, as shown in (E) of FIG. 10, the first protective layer 51_(1) to the (N−1)-th protective layer 51_(N−1) are removed.

Based on this, the required large-size nanoimprint substrate or the display substrate with the required nano pattern may be obtained.

In some embodiments, patterning the portion of the pattern transfer layer 20 located in the N-th imprint region 101_(N) to form the N-th imprint pattern 201_(N) includes S2041 to S2043.

In S2041, as shown in (A) of FIG. 10, an N-th adhesive layer 30_(N) is formed on the side of the pattern transfer layer 20 away from the base substrate 10.

In S2042, as shown in (B) and (C) of FIG. 10, the N-th adhesive layer 30_(N) is imprinted by using an imprint template 40_(N) to obtain an N-th imprinted adhesive layer 31_(N), the N-th imprinted adhesive layer 31_(N) including an N-th pattern 202_(N) to be transferred located in the N-th imprint region 101_(N).

In S2043, as shown in (D) of FIG. 10, the portion of the pattern transfer layer 20 located in the N-th imprint region 101_(N) is etched to form the N-th imprint pattern 201_(N) corresponding to the N-th pattern 202_(N) to be transferred.

S2041 to S2043 are similar to S2011 to S2013, and may refer to the foregoing content, which is not repeated here.

Figure 12:
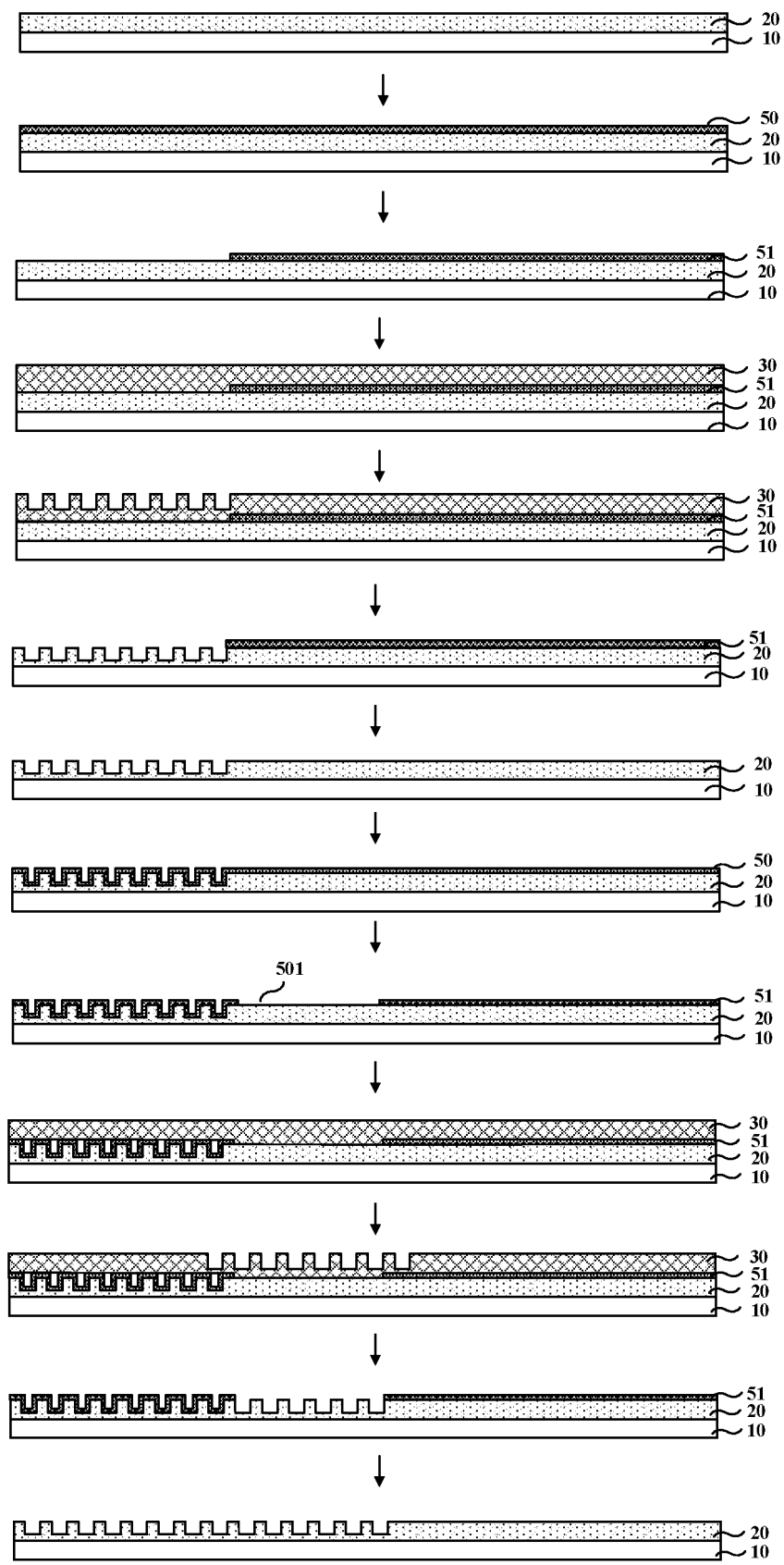
FIG. 12 is a process flow diagram of a method for manufacturing a nano pattern in an example.
Figure 13A:
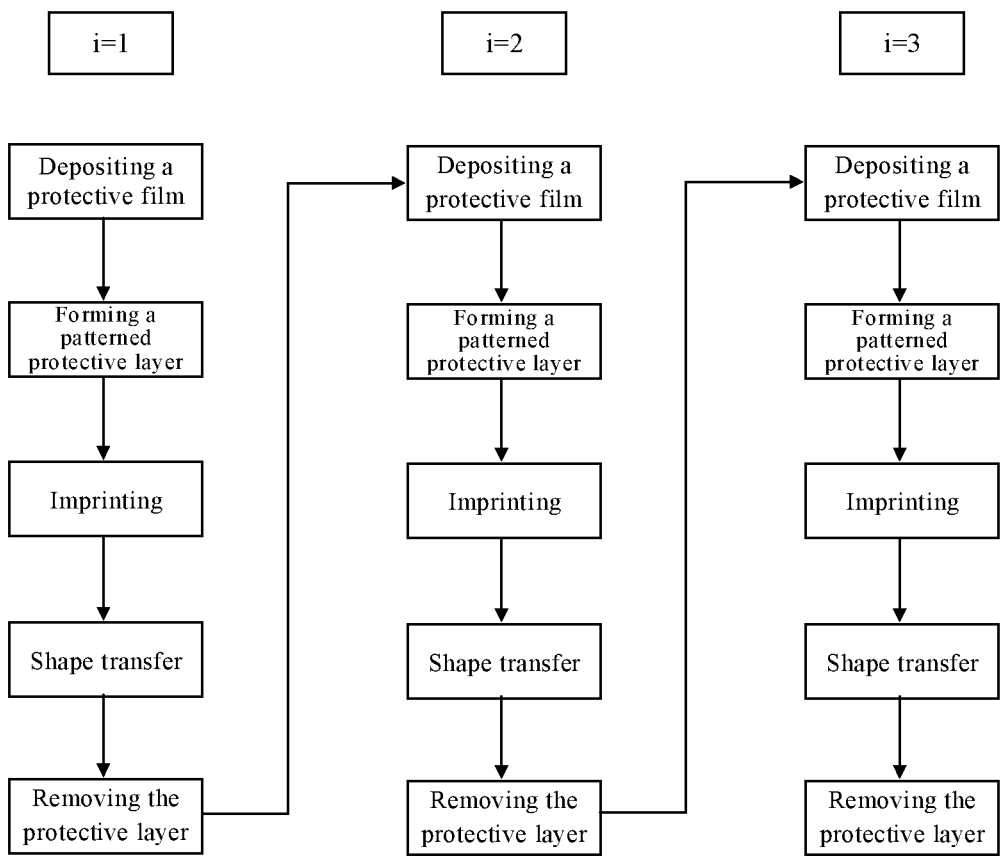
FIG. 13A is a flow block diagram of manufacturing a nano pattern in an example.
Figure 13B:
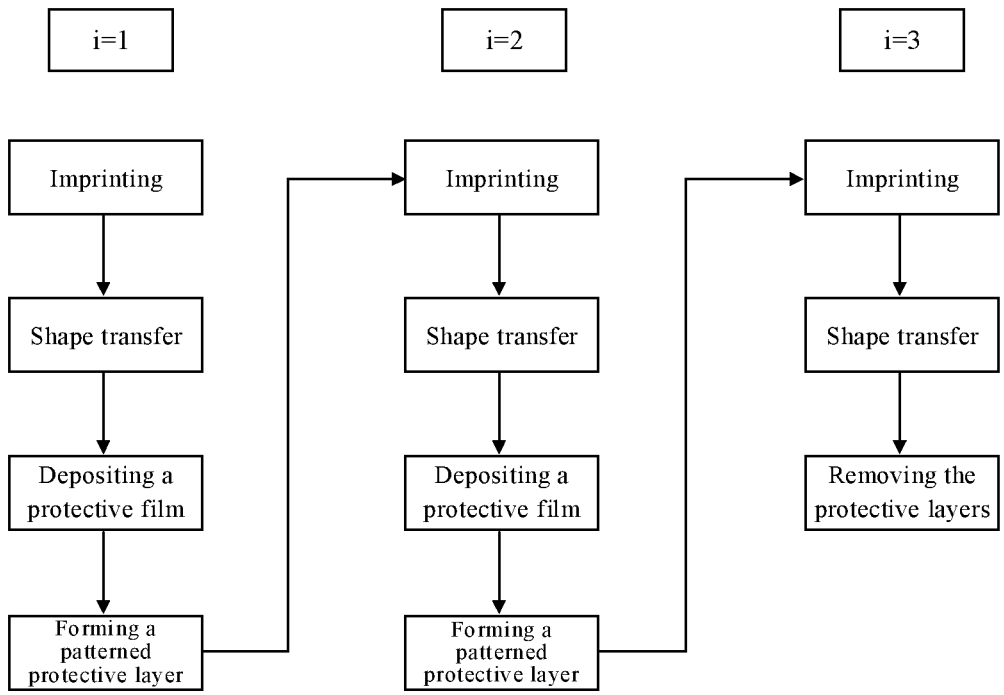
FIG. 13B is a flow block diagram of manufacturing a nano pattern, in accordance with some embodiments.

In an example, as shown in FIG. 12, each process of patterning a pattern transfer layer 20 requires five steps including depositing a protective film 50, forming a patterned protective layer 51, imprinting, shape transfer (i.e., etching the pattern transfer layer 20), and removing the protective layer 51, a process flow chart of which is shown in FIG. 13A. The method for manufacturing the nano pattern in some embodiments of the present disclosure is shown in FIG. 13B. In the processes of forming the first imprint pattern to the i-th imprint pattern in the first imprint region to the i-th imprint region in sequence, the process of forming each imprint pattern includes four steps including imprinting, shape transfer, depositing the protective film and forming the patterned protective layer. The process of forming the N-th imprint pattern in the N-th imprint region includes three steps including imprinting, shape transfer and removing the protective layers. That is, the first protective layer to the (N−1)-th protective layer do not need to be removed in the processes of forming the first imprint pattern to the i-th imprint pattern, but need to be removed after the N-th imprint pattern is formed. Thus, the number of process steps may be reduced to a great extent by compressing processes of removing the protective layers into one process step, which simplifies the process and improves efficiency.

It can be seen from the above that the first protective layer to the i-th protective layer may protect the formed first imprint pattern to the i-th imprint pattern from being damaged during the process of patterning the portion of the pattern transfer layer 20 located in the (i+1)-th imprint region 101_(i+1). In this case, materials of the first protective layer to the i-th protective layer need to ensure that they are not damaged when the pattern transfer layer 20 is etched. In addition, as shown in (A), (B) and (C) of FIG. 8, it also needs to be ensured that the etching process used for etching the i-th protective film 50_(i) does not damage the pattern transfer layer 20 when at least the portion of the i-th protective film 50_(i) located in the (i+1)-th imprint region 101_(i+1) is removed.

On this basis, performing the patterning process on the portion of the pattern transfer layer located in the i-th imprint region 101_(1) includes: etching the portion of the pattern transfer layer 20 located in the i-th imprint region 101_(i) through a first etching process. Removing at least the portion of the i-th protective film 50_(i) located in the (i+1)-th imprint region 101_(i+1) includes: removing at least the portion of the i-th protective film 50_(i) located in the (i+1)-th imprint region 101_(i+1) through a second etching process. The first etching process is different from the second etching process.

In some examples, the material of the pattern transfer layer 20 includes one of a metal material or a metal oxide material such as ITO or IGZO. The first etching process is a wet etching process using a first etching solution. That is, the portion of the pattern transfer layer 20 located in the i-th imprint region 101_(i) is wet-etched by using the first etching solution. In this case, the protective layer needs to use a material that is not damaged by the first etching solution. For example, the material of the protective layer includes $SiO_2$ or $SiN_x$. The second etching process is a wet etching process using a second etching solution. That is, the portion of the i-th protective film 50_(i) located in the (i+1)-th imprint region 101_(i+1) is wet-etched by using the second etching solution. The first etching solution is different from the second etching solution.

For example, the first etching solution is an alkaline etching solution, and the second etching solution is an acid etching solution.

In some other examples, the material of the pattern transfer layer 20 includes an organic material or at least one of inorganic non-metals (such as $SiO_2$, $SiN_x$ or a-Si). The first etching process is a dry etching process. In this case, the protective layer needs to use a material that is resistant to dry etching. For example, the material of the protective layer is at least one of metal or metal oxides such as ITO, IGZO. The second etching process is a wet etching process.

In some embodiments, the value of i starts from 1. In the case where the value of i is greater than or equal to 2 (that is, the value of i is 2 or j), an orthogonal projection of the i-th pattern 202_(i) to be transferred on the base substrate 10 and an orthogonal projection of at least one imprint pattern that is adjacent to the i-th imprint pattern 201_(i) to be formed on the base substrate 10 have an overlapping region. In other words, the orthogonal projection of the i-th pattern 202_(i) to be transferred on the base substrate 10 and an orthogonal projection of at least one imprint pattern that has been formed on the base substrate 10 have the overlapping region. An imprint region where each of the at least one imprint pattern that has been formed is located is adjacent to the i-th imprint region 101_(i).

Figure 11A:
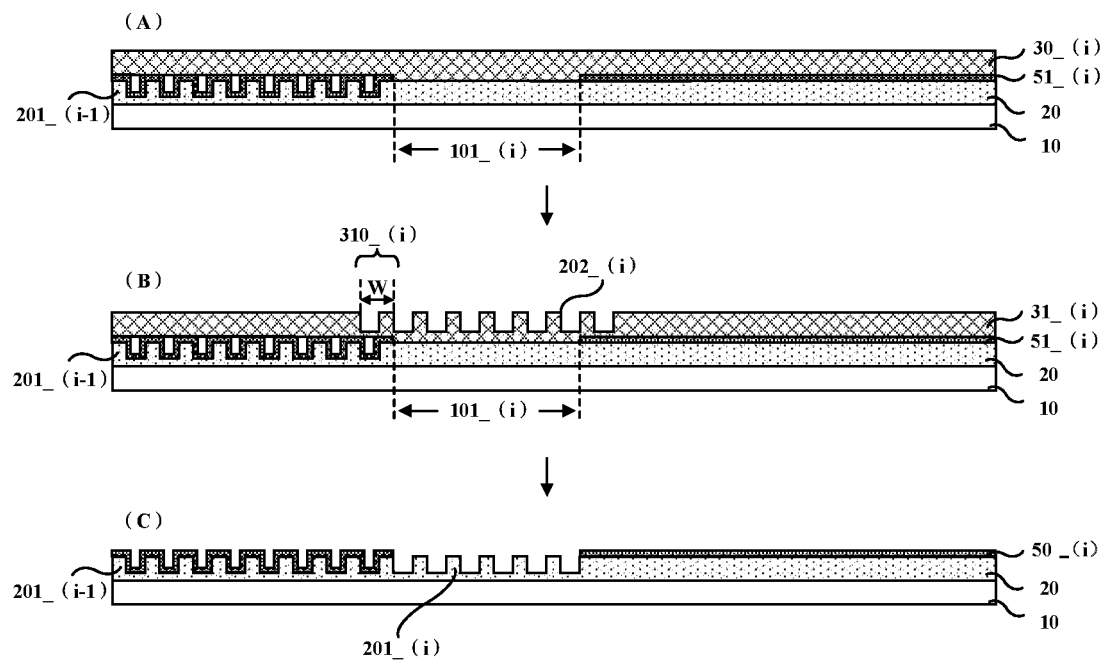
FIG. 11A is a schematic diagram of forming an i-th pattern to be transferred, in accordance with some embodiments.

For example, as shown in (B) of FIG. 11A, it is assumed that only the (i−1)-th imprint region 101_(i−1) in imprint regions adjacent to the i-th imprint region 101_(i) is provided with the (i−1)-th imprint pattern 201_(i−1) therein. The orthogonal projection of the i-th pattern 202_(i) to be transferred on the base substrate 10 and an orthogonal projection of the (i−1)-th imprint pattern 201_(i−1) on the base substrate 10 have an overlapping region 310_(i).

Figure 11B:
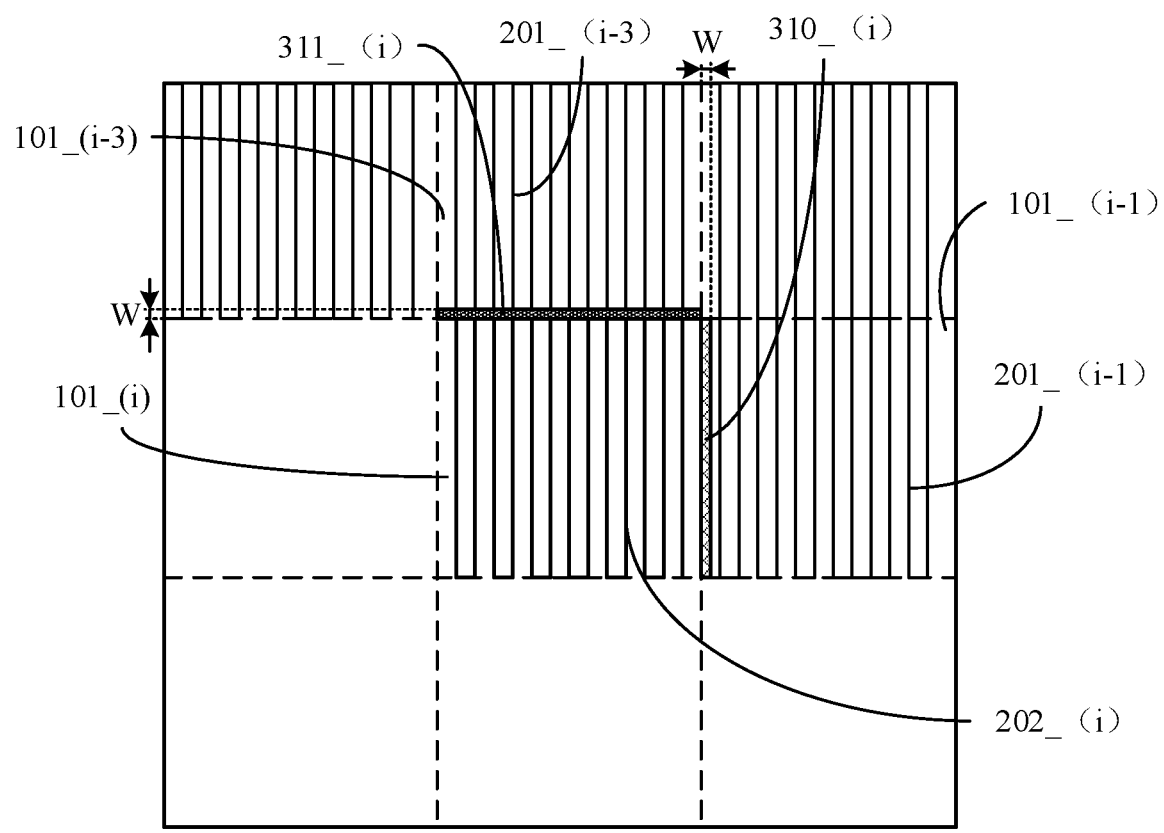
FIG. 11B is another schematic diagram of forming an i-th pattern to be transferred, in accordance with some embodiments.

For another example, as shown in FIG. 11B, it is assumed that the i-th imprint region 101_(i) is adjacent to the (i−1)-th imprint region 101_(i−1) and an (i−3)-th imprint region 101_(i−3). Before the i-th pattern 202_(i) to be transferred is formed, a portion of the pattern transfer layer 20 located in the (i−3)-th imprint region 101_(i−3) has been formed as an (i−3)-th imprint pattern 201_(i−3), and a portion of the pattern transfer layer 20 located in the (i−1)-th imprint region 101_(i−1) has been formed as the (i−1)-th imprint pattern 201_(i−1). The orthogonal projection of the i-th pattern 202_(i) to be transferred on the base substrate 10 and an orthogonal projection of the (i−3)-th imprint pattern 201_(i−3) on the base substrate 10 have an overlapping region 311_(i), and the orthogonal projection of the i-th pattern 202_(i) to be transferred on the base substrate 10 does not overlap the orthogonal projection of the (i−1)-th imprint pattern 201_(i−1) on the base substrate 10. Alternatively, the orthogonal projection of the i-th pattern 202_(i) to be transferred on the base substrate 10 and the orthogonal projection of the (i−1)-th imprint pattern 201_(i−1) on the base substrate have the overlapping region 310_(i), and the orthogonal projection of the i-th pattern 202_(i) to be transferred on the base substrate 10 does not overlap the orthogonal projection of the (i−3)-th imprint pattern 201_(i−3) on the base substrate 10. Alternatively, the orthogonal projection of the i-th pattern 202_(i) to be transferred on the base substrate 10 and the orthogonal projection of the (i−3)-th imprint pattern 201_(i−3) on the base substrate 10 have the overlapping region 311_(i), and the orthogonal projection of the i-th pattern 202_(i) to be transferred on the base substrate 10 and the orthogonal projection of the (i−1)-th imprint pattern 201_(i−1) on the base substrate have the overlapping region 310_(i).

The imprint adhesive located at edges of the imprint region flows in the imprinting process due to its fluidity, which causes low imprinting accuracy at edges of the pattern to be transferred, thereby affecting accuracy of the formed nano pattern. Setting the overlapping region described above makes edge(s) of the pattern to be transferred be located in imprint region(s) adjacent to a current imprint region. Each imprint pattern that has been formed is covered by the at least one protective layer, and portion(s) of the pattern to be transferred located in the overlapping region(s) are naturally formed above the protective layer(s) in the adjacent imprint region(s). The portion(s) with low imprinting accuracy are removed through an etching process without damaging the imprint pattern(s) which are located in the adjacent imprint region(s), thereby ensuring precision of the nano pattern.

For example, a dimension W of each overlapping region in a width direction thereof is 1 mm to 5 mm. The width direction refers to a direction perpendicular to a boundary of two adjacent imprint regions where the overlapping region is located on a surface of the base substrate 10 on which the pattern transfer layer 20 is provided. For example, the width W of each overlapping region is 1 mm, 1.5 mm, 2 mm, 3.5 mm, 4 mm, 4.5 mm or 5 mm.

The width of each overlapping region is set to 1 mm to 5 mm. It is enough to remove the portion at the edge of the pattern to be transferred with low precision, thereby ensuring the precision of the nano pattern. Furthermore, an area of an imprint every time is reasonable, and imprint efficiency is required.

Similarly, an orthogonal projection of the N-th pattern to be transferred on the base substrate 10 and an orthogonal projection of at least one imprint pattern adjacent to the N-th imprint pattern 201_(N) to be formed on the base substrate 10 have an overlapping region. The overlapping region may refer to the above description of the overlapping region(s) formed by the i-th pattern 202_(i) to be transferred and the adjacent imprint pattern(s), which is not repeated here.

In some embodiments, the pattern transfer layer 20 includes at least one film layer.

Figure 14:
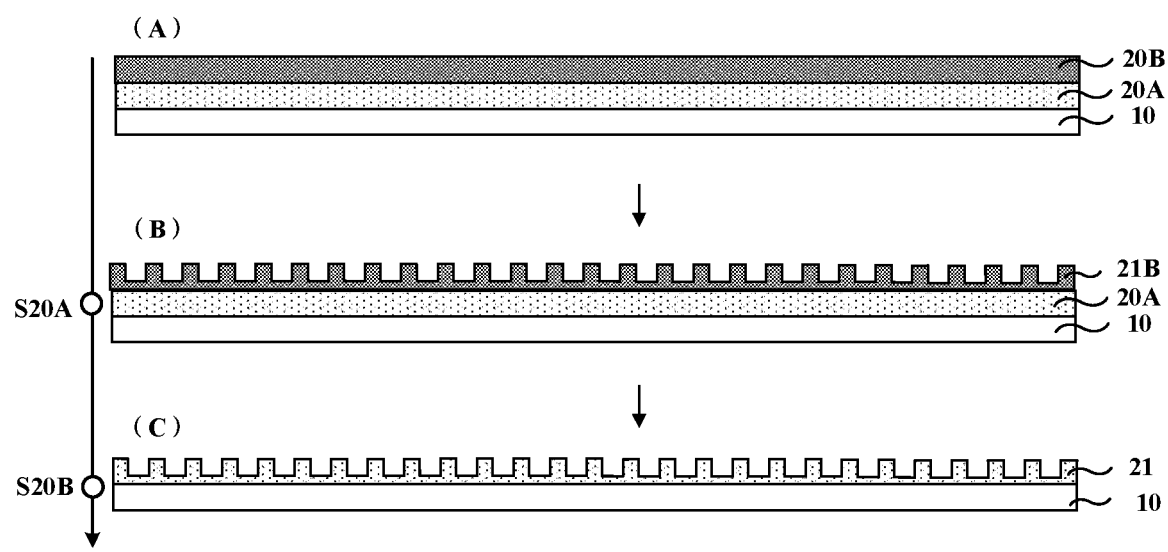
FIG. 14 is a schematic diagram of patterning a pattern transfer layer having a stacked structure in accordance with some embodiments.

In some examples, as shown in FIG. 14, the pattern transfer layer 20 is of a stacked structure including a plurality of layers. For example, the stacked structure is Al/SiO$_2$, a-Si/SiO$_2$, SiN$_x$/SiO$_2$, SiN$_x$/a-Si/SiO$_2$, SiO$_2$/a-Si/SiO$_2$, or the like, but embodiments of the present disclosure are not limited thereto, which may be selected according to actual needs.

A thickness of the stacked structure is determined by an etching selectivity and an actual required height. In some examples, a thickness of the pattern transfer layer 20 is 10 nm to 500 nm. For example, the thickness of the pattern transfer layer 20 is 50 nm to 200 nm, such as 50 nm, 60 nm, 80 nm, 100 nm, 130 nm, 150 nm, 180 nm or 200 nm.

The pattern transfer layer 20 of the stacked structure includes at least two film layers that are stacked in a thickness direction of the base substrate 10 and are in contact with each other. In this case, S20 includes S20A and S20B.

In S20A, as shown in (B) of FIG. 14, a film layer of the at least two film layers farthest from the base substrate 10 is patterned multiple times, so as to form a transition to imprint pattern layer 21B with N transition imprint patterns.

Herein, a shape of a transition imprint pattern is the same as a shape of the above imprint pattern in each imprint region.

In S20B, as shown in (C) of FIG. 14, the transition imprint pattern layer and a remaining film layer of the at least two film layers are etched until a film layer closest to the base substrate 10 is etched to form the imprint pattern layer 21 corresponding to the transition imprint pattern layer.

For example, the stacked structure includes two film layers that are stacked and in contact with each other in the thickness direction of the base substrate 10. As shown in (A) of FIG. 14, two film layers 20A and 20B of the pattern transfer layer 20 are sequentially formed on the base substrate 10. The second film layer 20B is located on a side of the first film layer 20A away from the base substrate 10, and a surface of the first film layer 20A away from the base substrate 10 is in direct contact with a surface of the second film layer 20B proximate to the first film layer 20A. In this case, as shown in (B) of FIG. 14, the second film layer 20B is patterned multiple times to form the transition imprint pattern layer 21B. A portion of the transition imprint pattern layer 21B located in each imprint region is a transition imprint pattern, and the N transition imprint patterns are formed in sequence. The patterning processes may refer to the relevant contents of S201 to S205, which is not repeated here. As shown in (C) of FIG. 14, the transition imprint pattern layer 21B and the first film layer 20A are etched, so that the first film layer 20A is formed as the imprint pattern layer 21, and this process may refer to the related contents of S2013, which is not repeated here.

For the stacked structure including the two film layers, the second film layer 20B is firstly transformed into the transition imprint pattern layer with the complete N transition imprint patterns, and then the transition imprint pattern layer is used as a template for etching the first film layer 20A to obtain the final nano pattern, thereby improving the accuracy of forming the nano pattern.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A method for manufacturing a nano pattern, comprising:
    forming a pattern transfer layer on a base substrate, wherein the pattern transfer layer has N imprint regions, N is an integer greater than or equal to 2; and
    performing a plurality of patterning processes on the pattern transfer layer to form an imprint pattern layer, wherein a portion of the imprint pattern layer located in each imprint region is an imprint pattern, N imprint patterns are formed in sequence; forming an i-th imprint pattern in an i-th imprint region, i being an integer greater than or equal to 1 and less than or equal to (N−1) includes:
        performing a patterning process in the plurality of patterning processes on a portion of the pattern transfer layer located in the i-th imprint region to form the i-th imprint pattern;
        forming an i-th protective film on a side of the pattern transfer layer away from the base substrate; and
        removing at least a portion of the i-th protective film located in an (i+1)-th imprint region to obtain an i-th protective layer and expose a portion of the pattern transfer layer located in the (i+1)-th imprint region, the i-th protective layer being located at least in the i-th imprint region;
    wherein performing the patterning process on the portion of the pattern transfer layer located in the i-th imprint region to form the i-th imprint pattern includes:
        forming an i-th adhesive layer on the side of the pattern transfer layer away from the base substrate;
        imprinting the i-th adhesive layer to obtain an i-th imprinted adhesive layer, the i-th imprinted adhesive layer including an i-th pattern to be transferred located in the i-th imprint region; and
        etching the portion of the pattern transfer layer located in the i-th imprint region to form the i-th imprint pattern corresponding to the i-th pattern to be transferred.

2. The method according to claim 1, wherein a value of i starts from 1.

3. The method according to claim 2, wherein the value of i is greater than or equal to 2; and
    an orthogonal projection of the i-th pattern to be transferred on the base substrate and an orthogonal projection of at least one imprint pattern adjacent to the i-th imprint pattern to be formed on the base substrate have an overlapping region.

4. The method according to claim 3, wherein a dimension of each overlapping region in a width direction thereof is 1 mm to 5 mm, the width direction is a direction, on a surface of the base substrate on which the pattern transfer layer is disposed, perpendicular to a boundary of two adjacent imprint regions where the overlapping region is located.

5. The method according to claim 1, wherein forming an N-th imprint pattern in an N-th imprint region includes:
    performing a patterning process in the plurality of patterning processes on a portion of the pattern transfer layer located in the N-th imprint region to form the N-th imprint pattern; and
    removing a first protective layer to an (N−1)-th protective layer.

6. The method according to claim 5, wherein performing the patterning process on the portion of the pattern transfer layer located in the N-th imprint region to form the N-th imprint pattern includes:
    forming an N-th adhesive layer on the side of the pattern transfer layer away from the base substrate;
    imprinting the N-th adhesive layer to obtain an N-th imprinted adhesive layer, the N-th imprinted adhesive layer including an N-th pattern to be transferred located in the N-th imprint region; and
    etching the portion of the pattern transfer layer located in the N-th imprint region to form the N-th imprint pattern corresponding to the N-th pattern to be transferred.

7. The method according to claim 6, wherein an orthogonal projection of the N-th pattern to be transferred on the base substrate and an orthogonal projection of at least one imprint pattern adjacent to the N-th imprint pattern to be formed on the base substrate have an overlapping region.

8. The method according to claim 1, wherein removing at least the portion of the i-th protective film located in the (i+1)-th imprint region to obtain the i-th protective layer includes:
    removing a remaining portion of the i-th protective film other than a portion located in the i-th imprint region to obtain the i-th protective layer.

9. The method according to claim 1, wherein a thickness of the i-th protective film is 20 nm to 100 nm.

10. The method according to claim 1, wherein the pattern transfer layer includes at least one film layer.

11. The method according to claim 10, wherein the pattern transfer layer includes at least two film layers that are stacked and in contact with each other in a thickness direction of the base substrate; performing the plurality of patterning processes on the pattern transfer layer to form the imprint pattern layer includes:
    performing the plurality of patterning processes on a film layer, farthest from the base substrate, of the at least two film layers to form a transition imprint pattern layer having N transition imprint patterns; and
    etching the transition imprint pattern layer and a remaining film layer of the at least two film layers until a film layer, closest to the base substrate, of the at least two film layers is etched to form the imprint pattern layer corresponding to the transition imprint pattern layer.

12. The method according to claim 1, wherein a thickness of the pattern transfer layer is 10 nm to 500 nm.

13. A nanoimprint substrate comprising a nano pattern, the nano pattern being manufactured by the method according to claim 1.

14. A display substrate comprising a nano pattern, the nano pattern being manufactured by the method according to claim 1.

15. A method for manufacturing a nano pattern, comprising:
forming a pattern transfer layer on a base substrate, wherein the pattern transfer layer has N imprint regions, N is an integer greater than or equal to 2; and
performing a plurality of patterning processes on the pattern transfer layer to form an imprint pattern layer, wherein a portion of the imprint pattern layer located in each imprint region is an imprint pattern, N imprint patterns are formed in sequence; forming an i-th imprint pattern in an i-th imprint region, i being an integer greater than or equal to 1 and less than or equal to (N−1) includes:
performing a patterning process in the plurality of patterning processes on a portion of the pattern transfer layer located in the i-th imprint region to form the i-th imprint pattern;
forming an i-th protective film on a side of the pattern transfer layer away from the base substrate; and
removing at least a portion of the i-th protective film located in an (i+1)-th imprint region to obtain an i-th protective layer and expose a portion of the pattern transfer layer located in the (i+1)-th imprint region, the i-th protective layer being located at least in the i-th imprint region; wherein
performing the patterning process on the portion of the pattern transfer layer located in the i-th imprint region includes: etching the portion of the pattern transfer layer located in the i-th imprint region through a first etching process;
removing at least the portion of the i-th protective film located in the (i+1)-th imprint region includes:
removing at least the portion of the i-th protective film located in the (i+1)-th imprint region through a second etching process; and
the first etching process is different from the second etching process.

16. The method according to claim 15, wherein the first etching process is a dry etching process, and the second etching process is a wet etching process.

17. The method according to claim 16, wherein a material of the pattern transfer layer includes at least one of silicon dioxide ($SiO_2$), silicon nitride ($SiN_x$), amorphous silicon (a-Si) or an organic material; and
a material of the i-th protective layer includes at least one of indium tin oxide (ITO), indium gallium zinc oxide (IGZO) or metal.

18. The method according to claim 15, wherein etching the portion of the pattern transfer layer located in the i-th imprint region through the first etching process includes: performing wet etching on the portion of the pattern transfer layer located in the i-th imprint region through a first etching solution;
removing at least the portion of the i-th protective film located in the (i+1)-th imprint region through the second etching process includes: performing wet etching on at least the portion of the i-th protective film located in the (i+1)-th imprint region through a second etching solution; and
the first etching solution is different from the second etching solution.

19. The method according to claim 18, wherein a material of the pattern transfer layer includes at least one of indium tin oxide (ITO), indium gallium zinc oxide (IGZO) or metal; and
a material of the i-th protective layer includes at least one of silicon dioxide ($SiO_2$) or silicon nitride ($SiN_x$).

* * * * *